(12) United States Patent
Gupta et al.

(10) Patent No.: US 10,641,810 B2
(45) Date of Patent: May 5, 2020

(54) DETECTING USER-DRIVEN OPERATING STATES OF ELECTRONIC DEVICES FROM A SINGLE SENSING POINT

(71) Applicant: UNIVERSITY OF WASHINGTON, Seattle, WA (US)

(72) Inventors: Sidhant Gupta, Seattle, WA (US); Ke-Yu Chen, Seattle, WA (US); Shwetak N. Patel, Seattle, WA (US)

(73) Assignee: University of Washington, Seattle, WA (US)

( * ) Notice: Subject to any disclaimer, the term of this patent is extended or adjusted under 35 U.S.C. 154(b) by 207 days.

(21) Appl. No.: 15/506,619

(22) PCT Filed: Sep. 4, 2015

(86) PCT No.: PCT/US2015/048617
§ 371 (c)(1),
(2) Date: Feb. 24, 2017

(87) PCT Pub. No.: WO2016/037095
PCT Pub. Date: Mar. 10, 2016

(65) Prior Publication Data
US 2018/0224492 A1 Aug. 9, 2018

Related U.S. Application Data

(60) Provisional application No. 62/046,037, filed on Sep. 4, 2014, provisional application No. 62/085,080, filed on Nov. 26, 2014.

(51) Int. Cl.
*G01R 31/00* (2006.01)

(52) U.S. Cl.
CPC .................. *G01R 31/001* (2013.01)

(58) Field of Classification Search
CPC .................. G01R 31/001; G05B 23/021
See application file for complete search history.

(56) References Cited

U.S. PATENT DOCUMENTS

| 3,714,516 A | 1/1973 | Howe |
| 4,612,617 A | 9/1986 | Laplace, Jr. et al. |

(Continued)

FOREIGN PATENT DOCUMENTS

| AR | 070667 A1 | 4/2010 |
| CA | 2705528 A1 | 5/2009 |

(Continued)

OTHER PUBLICATIONS

International search report and written opinion dated Jan. 19, 2016 for PCT/US2015/048617.

(Continued)

*Primary Examiner* — Lisa E Peters
(74) *Attorney, Agent, or Firm* — Dorsey & Whitney LLP

(57) ABSTRACT

An apparatus including a sensing device configured to be coupled to an electrical outlet is provided. The sensing device can include a data acquisition receiver configured to receive electrical noise via the electrical outlet when the sensing device is coupled to the electrical outlet. The electrical outlet can be electrically coupled to an electrical power infrastructure. One or more electrical devices can be coupled to the electrical power infrastructure and can generate at least a portion of the electrical noise on the electrical power infrastructure. The data acquisition receiver can be configured to convert the electrical noise into one or more first data signals. The apparatus also can include a processing module configured to run on a processor of a computational unit. The sensing device can be in communication with the computational unit. The processing module can be further configured to identify each of two or more operating states of each of the one or more electrical devices at least in part using the (Continued)

one or more first data signals. The two or more operating states of each electrical device of the one or more electrical devices can be each different user-driven operating states of the electrical device when the electrical device is in an on-power state. Other embodiments are provided.

20 Claims, 19 Drawing Sheets

(56) References Cited

U.S. PATENT DOCUMENTS

| | | |
|---|---|---|
| 4,804,957 A | 2/1989 | Selph et al. |
| 4,858,141 A | 8/1989 | Hart et al. |
| 5,276,629 A | 1/1994 | Reynolds |
| 5,409,037 A | 4/1995 | Wheeler et al. |
| 5,441,070 A | 8/1995 | Thompson |
| 5,483,153 A | 1/1996 | Leeb et al. |
| 5,590,179 A | 12/1996 | Shincovich et al. |
| 5,635,895 A | 6/1997 | Murr |
| 5,717,325 A | 2/1998 | Leeb et al. |
| 5,898,387 A | 4/1999 | Davis et al. |
| 6,275,168 B1 | 8/2001 | Slater et al. |
| 6,622,097 B2 | 9/2003 | Hunter |
| 6,728,646 B2 | 4/2004 | Howell et al. |
| 6,743,806 B2 | 6/2004 | Hong |
| 6,816,078 B2 | 11/2004 | Onoda et al. |
| 6,839,644 B1 | 1/2005 | Woods et al. |
| 6,853,291 B1 | 2/2005 | Aisa |
| 6,906,617 B1 | 6/2005 | Van Der Meulen |
| 6,910,025 B2 | 6/2005 | Cao |
| 6,993,417 B2 | 1/2006 | Osann et al. |
| 7,019,666 B2 | 3/2006 | Tootoonian |
| 7,043,380 B2 | 5/2006 | Rodenberg et al. |
| 7,049,976 B2 | 5/2006 | Hunt et al. |
| 7,134,568 B2 | 11/2006 | Moriyama et al. |
| 7,174,260 B2 | 2/2007 | Tuff et al. |
| 7,276,915 B1 | 10/2007 | Euler et al. |
| 7,330,796 B2 | 2/2008 | Addink et al. |
| 7,400,986 B2 | 7/2008 | Latham et al. |
| 7,460,930 B1 | 12/2008 | Howell et al. |
| 7,493,221 B2 | 2/2009 | Caggiano et al. |
| 7,498,935 B2 | 3/2009 | Kodama et al. |
| 7,508,318 B2 | 3/2009 | Casella et al. |
| 7,541,941 B2 | 6/2009 | Bogolea et al. |
| 7,546,214 B2 | 6/2009 | Rivers et al. |
| 7,589,942 B2 | 9/2009 | Kumfer et al. |
| 7,612,971 B2 | 11/2009 | Premerlani et al. |
| 7,613,576 B2 | 11/2009 | Gross et al. |
| 7,656,649 B2 | 2/2010 | Loy et al. |
| 7,692,555 B2 | 4/2010 | Stanley et al. |
| 7,693,670 B2 | 4/2010 | Durling et al. |
| 7,702,421 B2 | 4/2010 | Sullivan et al. |
| 7,705,484 B2 | 4/2010 | Horst |
| 7,706,928 B1 | 4/2010 | Howell et al. |
| 7,719,257 B2 | 5/2010 | Robarge et al. |
| 7,729,993 B2 | 6/2010 | Baraty et al. |
| 7,747,357 B2 | 6/2010 | Murdoch |
| 7,885,917 B2 | 2/2011 | Kuhns et al. |
| 7,889,061 B2 | 2/2011 | Endo |
| 8,078,431 B2 | 12/2011 | Brown |
| 8,094,034 B2 | 1/2012 | Patel et al. |
| 8,334,784 B2 | 12/2012 | Patel et al. |
| 8,624,424 B2 | 1/2014 | Yogeeswaran et al. |
| 8,712,732 B2 | 4/2014 | Patel et al. |
| 2001/0003286 A1 | 6/2001 | Philippbar et al. |
| 2002/0010690 A1 | 1/2002 | Howell et al. |
| 2003/0050737 A1 | 3/2003 | Osann et al. |
| 2003/0088527 A1 | 5/2003 | Hung et al. |
| 2003/0097348 A1 | 5/2003 | Cao |
| 2003/0193405 A1 | 10/2003 | Hunt et al. |
| 2004/0128034 A1 | 7/2004 | Lenker et al. |
| 2004/0140908 A1 | 7/2004 | Gladwin et al. |
| 2004/0148908 A1 | 8/2004 | Focke et al. |
| 2004/0206405 A1 | 10/2004 | Smith et al. |
| 2005/0060107 A1 | 3/2005 | Rodenberg et al. |
| 2005/0067049 A1 | 3/2005 | Fima |
| 2006/0009928 A1 | 1/2006 | Addink et al. |
| 2006/0077046 A1 | 4/2006 | Endo |
| 2006/0103549 A1 | 5/2006 | Hunt et al. |
| 2006/0195275 A1 | 8/2006 | Latham et al. |
| 2006/0245467 A1 | 11/2006 | Casella et al. |
| 2006/0259201 A1 | 11/2006 | Brown |
| 2007/0114987 A1 | 5/2007 | Kagan |
| 2008/0030075 A1 | 2/2008 | Stanley et al. |
| 2008/0079437 A1 | 4/2008 | Robarge et al. |
| 2008/0086394 A1 | 4/2008 | O'Neil et al. |
| 2008/0091345 A1 | 4/2008 | Patel et al. |
| 2008/0108388 A1* | 5/2008 | Ebrom .............. D06F 39/005 455/557 |
| 2008/0167755 A1 | 7/2008 | Curt |
| 2008/0224892 A1 | 9/2008 | Bogolea et al. |
| 2008/0255782 A1 | 10/2008 | Bilac et al. |
| 2008/0308254 A1 | 12/2008 | Premerlani et al. |
| 2009/0043520 A1 | 2/2009 | Pollack et al. |
| 2009/0072985 A1 | 3/2009 | Patel et al. |
| 2010/0030393 A1 | 2/2010 | Masters et al. |
| 2010/0030939 A1 | 2/2010 | Litovtchenko et al. |
| 2010/0070214 A1 | 3/2010 | Hyde et al. |
| 2010/0070218 A1 | 3/2010 | Hyde et al. |
| 2010/0109842 A1 | 5/2010 | Patel et al. |
| 2010/0148579 A1 | 6/2010 | Maloney |
| 2010/0188262 A1 | 7/2010 | Reymann et al. |
| 2011/0004421 A1 | 1/2011 | Rosewell et al. |
| 2011/0307200 A1 | 12/2011 | Hsu et al. |
| 2012/0092142 A1 | 4/2012 | Patel et al. |
| 2013/0049466 A1* | 2/2013 | Adams ................ G06F 1/266 307/39 |
| 2013/0080092 A1* | 3/2013 | Yogeeswaran .......... H02J 3/02 702/60 |
| 2013/0124123 A1 | 5/2013 | Patel et al. |
| 2013/0179124 A1 | 7/2013 | Patel et al. |
| 2014/0129041 A1* | 5/2014 | Williams ............ G05B 13/02 700/295 |
| 2014/0130073 A1* | 5/2014 | Yu .................. H04N 21/44222 725/14 |
| 2014/0371942 A1* | 12/2014 | Matsuyama ........... H02J 3/14 700/297 |
| 2015/0253362 A1* | 9/2015 | Louzir ............ G01R 19/2513 324/126 |
| 2015/0254482 A1* | 9/2015 | Louzir ............. G01R 21/133 324/258 |
| 2016/0238638 A1* | 8/2016 | Scheiermann ..... G01R 31/2825 |

FOREIGN PATENT DOCUMENTS

| | | |
|---|---|---|
| CN | 101523226 A | 9/2009 |
| CN | 101535819 A | 9/2009 |
| CN | 101680676 A | 3/2010 |
| CN | 102901869 A | 1/2013 |
| CN | 202794327 U | 3/2013 |
| DE | 102007032053 A1 | 1/2009 |
| EP | 1136829 A1 | 9/2001 |
| EP | 1444527 A2 | 8/2004 |
| EP | 2171363 A1 | 4/2010 |
| EP | 2174395 A1 | 4/2010 |
| EP | 2188879 A1 | 5/2010 |
| FR | 2645968 A1 | 10/1990 |
| GB | 2461915 A | 1/2010 |
| GB | 2464634 A | 4/2010 |
| GB | 2464927 A | 5/2010 |
| GB | 2465367 A | 5/2010 |
| GB | 2465800 A | 6/2010 |
| JP | 2007198965 A | 8/2007 |
| JP | 2010216948 A | 9/2010 |
| JP | 2013531450 A | 8/2013 |
| JP | 5530019 B1 | 4/2014 |
| KR | 20090057058 A | 6/2009 |
| KR | 20090057071 A | 6/2009 |
| KR | 20100021458 A | 2/2010 |
| KR | 20100021604 A | 2/2010 |
| WO | WO-9304377 A1 | 3/1993 |
| WO | WO-03003029 A2 | 1/2003 |

(56) References Cited

FOREIGN PATENT DOCUMENTS

| WO | WO-2008042483 A1 | 4/2008 |
|---|---|---|
| WO | WO-2008153576 A1 | 12/2008 |
| WO | WO-2008153577 A1 | 12/2008 |
| WO | WO-2009040140 A1 | 4/2009 |
| WO | WO-2009063397 A2 | 5/2009 |
| WO | WO-2009081407 A2 | 7/2009 |
| WO | WO-2010007369 A2 | 1/2010 |
| WO | WO-2010062398 A1 | 6/2010 |
| WO | WO-2016037095 A1 | 3/2016 |

OTHER PUBLICATIONS

8devices. Carambola Embedded Module.
Abdeslam, et al. A unified artificial neural network architecture for active power filters. Industrial, 54(1):61-76, 2007.
Abdeslam, et al. Artificial neural networks for harmonic estimation in low-voltage power systems. 4th international ICSC. 2004.
Abreu, et al. Using pattern recognition to identify habitual behavior in residential electricity consumption. In Proc. of Energy and Buildings.] 2, pp. 479-487.
Acosta, et al. A current monitoring system for diagnosing electrical failures in induction motors. Mechanical Systems and Signal Processing, 20(4):953-965, 2006.
Armel, et al. Is disaggregation the holy grail of energy efficiency? The case of electricity. Energy Policy, 52:213-234, Oct. 2012.
Armstrong, et al. Fault detection based on motor start transients and shaft harmonics measured at the RTU electrical service. 2004.
Arvola, A., et al. "Billing Feedback as Means to Encourage Household Electricity Conservation: A Field experiment in Helsinki," Proceedings of the 1993 Summer Study of the European Council for Energy Efficient Economy, Jun. 2-7, 2003, pp. 11-21, Saint-Raphael, France.
Beckmann, C. et al., "Some Assembly Required: Supporting End-User Sensor Installation in Domestic Ubiquitous Computing Environments," UbiComp 2004: Ubiquitous Computing: 6th International Conference, Sep. 7-10, 2004, pp. 107-124, Nottingham, UK.
Benbouzid. A review of induction motors signature analysis as a medium for faults detection. Industrial Electronics, IEEE Transactions on, 47(5):984-993, 2000.
Bidgely. Bidgely.
Bin, S. and Dowlatabadi, H. Consumer lifestyle approach to US energy use and the related CO2 emissions. Energy Policy 33, 2 (2005), 197-208.
Brandon, G. et al. "Reducing Household Energy Consumption: A Qualitative and Quantitative Field Study," Journal of Environmental Psychology, Mar. 1999, pp. 75-85, Academic Press, vol. 19, No. 1.
"California Energy Commission. Final Report Compilation for Equipment Scheduling and Cycling, Oct. 2003. 291 pages".
Cardoso, et al. Inter-turn stator winding fault diagnosis in three-phase induction motors, by Park's vector approach. Energy Conversion, IEEE Transactions on, 14(3):595-598, 1999.
Chen, J., et al. "Bathroom Activity Monitoring Based on Sound," Pervasive Computing, 2005, pp. 47-61.
Cohn, et al. GasSense: Appliance-Level, Single-Point Sensing of Gas Activity in the Home. In Proc. of Pervasive'10, pp. 265-282. 2010.
Cole, et al. Algorithm for nonintrusive identification of residential ap¬pliances. In Circuits and Systems, 1998. ISCAS '98. Proceedings of the 1998 IEEE International Symposium on, vol. 3, pp. 338-341 vol. 3, 1998.
Cole, et al. Data extraction for effective non-intrusive identification of residential power loads. In Instrumentation and Measurement Technology Conference, 1998. Di TC/98. Conference Proceedings. IEEE, vol. 2, pp. 812-815 vol. 2, May 1998.
Compliance Certification Services (Shenzhen) Inc., "FCC Class B Compliance Report," prepared for Jet Way Information Co., Ltd., Dec. 29, 2006, 20 pages.

Darby, S., "Making it Obvious: Designing Feedback into Energy Consumption," Proceedings of the Second International Conference on Energy Efficiency in Household Appliances and Lighting, 2000, 11 pages.
Darby. The Effectiveness of Feedback on Energy Consumption: A Review for DEFRA on the Literature on Metering, Billing and Direct Displays. Environmental Change Institute: 21 pp., 2006.
Dash, et al. Harmonic estimation in a power system rising adaptive perceptrons. 1996.
"Den Boer. Active matrix liquid crystal displays. 1st edition. Publisher summary. Elsevier. (Sep. 2, 2011).".
Ehrhardt-Martinez, et al. Advanced metering initiatives and residential feedback programs: a meta-review for household electricity-saving opportunities. 2010.
"Energy Star. Program Requirements for Single Voltage External Ac-Dc and Ac-Ac Power Supplies, Eligibility Criteria (Version 2.0) Final Draft . 11 pages. 2008".
Enev, et al. Televisions, video privacy, and powerline electromagnetic interference. CCS'11. Oct. 17-21, 2011. Chicago, Il, USA. 537-550. 14 pages.
"Englert, et al. How to auto-configure your smart home?: High-resolution power measurements to the rescue. Proceedings of the fourth international conference on Future energy systems. ACM,2013. 10 pages.".
"EP 15837963.6 Office Action dated Apr. 30, 2018".
European search report with written opinion dated Apr. 30, 2018 for EP Application No. 3189608.
"Eurostat. Environment and energy. Europe in figures—Eurostat yearbook 2010. 2010. 70 pages".
Fischer, C., "Feedback on Household Electricity Consumption: A Tool for Saving Energy?," Energy Efficiency (2008), Mar. 28, 2008, pp. 79-104.
Fishkin, et al. Guide: Towards Understanding Daily Life via Auto-Identification and Statistical Analysis. In Proc. of Ubillealth'03.
Fogarty, J., Au, C. and Hudson, S., "Sensing from the Basement: A Feasibility Study of Unobtrusive and Low-Cost Home Activity Recognition," In the Proceedings of ACM Symposium on User Interface Software and Technology (UIST'06), Oct. 15-18, 2006, 10 pages.
Froehlich, et al. Disaggregated End-Use Energy Sensing for the Smart Grid. IEEE Pervasive Computing 10, 1(2011), pp. 28-39.
Froehlich, et. al., "Hydro-Sense: Infrastructure-Mediated Single-Point Sensing of Whole-Home Water Activity," In Proc. of UbiComp 2009, Sep.-Oct. 2009, pp. 235-244, Florida.
Froehlich, J., et al. "Sensing Opportunities for Personalized Feedback Technology to Reduce Consumption," DUB Institute, Department of Computer Science and Engineering, University of Washington, CHI Sustainability Workshop, In the extended proceedings of CHI 2009, 2009, 7 pages.
Froehlich, J.E., "Sensing and Feedback of Everyday Activities to Promote Environmentally Sustainable Behaviors," Thesis Proposal, Computer Science & Engineering, University of Washington, Jul. 23, 2009, 35 pages, Seattle, Washington.
Giri, et al. Towards automated appliance recogni¬tion using an {EMF} sensor in INILM)-platforms. Advanced Engineering Informatics, 27(0477-485, 2013.
"Globe Newswire. Home Energy Management Systems Market to Reach US$1,909.4 Million in 2019—Transparency Market Research. Website: https://www.cnbc.com/2014/10/31/globe-newswire-home-energy-management-systems-market-to-reach-us19094-million-in-2019--transparency-market. Published online: Oct. 31, 2014. 3 pages".
"Gulati, et al. An in depth study into using EMI signatures for appliance identification. Proceedings of the 1st ACM Conference on Embedded Systems for Energy-Efficient Buildings. ACM, 2014. pp. 70-79.".
Gupta, et al. ElectriSense: Single-Point Sensing Using EMI for Electrical Event Detection and Classification in the Home. In Proc. of UbiComp'10, pp. 139-148.
Hart. Nonintrusive appliance load monitoring. In Proc. of the IEEE 80. 12 (1992), pp. 1870-1891.

(56) References Cited

OTHER PUBLICATIONS

Hirsch, T., et al. "The ELDer Project: Social, Emotional, and Environmental Factors in the Design of Eldercare Technologies," Conference on Universal Usability 2000, Nov. 16-17, 2000, pp. 72-79, Arlington, Virginia.
"Ito et al. A method of appliance detection based on features of power waveform, Los Alamitos, CA, USA, IEEE Comput, Soc., US, Jan. 26, 2004, pp. 291-294".
Jiang, et al. Power Load Event Detection and Classification Based on Edge Symbol Analysis and Support Vector Ma¬chine. Applied Computational Intelligence and Soft Computing, 2012:1-10, 2012.
"Kaggle website. Belkin Energy Disaggregation Competition. Available at https://www.kaggle.com/c/belkin-energy-disaggregation-competition. Accessed on Jul. 26, 2018".
Kang, et al. Noninvasive on-line condition monitoring of on load tap changers. In Power Engineering Society Winter Meeting, 2000. IEEE, vol. 3, pp. 2223-2228 IEEE, 2000.
Kim, et al. Unsupervised Disaggregation of Low Frequency Power Measurements. In Proc. of SDM'10, pp. 747-758.
Kim, Y., et al. "ViridiScope: Design and Implementation of a Fine Grained Power Monitoring System for Homes," In the Proceedings of UbiComp, Sep. 30, 2009, 10 pages.
Kleiminger, et al. Occupancy Detection from Electricity Consumption Data. In Proc. of BuildSys'13, pp. 1-8.
Kliman, et al. Noninvasive detection of broken rotor bars in operating induction motors. Energy Conversion, IEEE Transactions on, 3(4):873-879, 1988.
Koile, K., et al. "Activity Zones for Context-Aware Computing," Proceedings of UbiComp 2003, Oct. 12-15, 2003, pp. 90-106.
Kolter, et al. Approximate Inference in Additive Factorial HMMs with Application to Energy Disaggregation. Proceedings of Machine Learning Research 22:1472-1482 (2012).
Laughman, C., Lee, K., Cox, R., Shaw, S., Leeb, S., Norford, L. and Armstrong, P., "Power Signature Analysis," Power and Energy Magazine, IEEE, Mar.-Apr. 2003, pp. 56-63.
Leeb, et al. Transient Event Detection in Spectral Envelope Estimates. IEEE Transactions on Power Delivery, 10(3):1200-1.210, 1995.
Liang, et al. Load Signature Study Part I: Basic Concept, Structure, and Methodology. IEEE Transactions on Power Delivery 25, 2 (2010), pp. 551-560.
Liang, et al. Load Signature Study Part II : Disaggregation Framework , Simulation , and Applications. Power, 25(2):561-569, 2010.
Logan, et al. A long-term evaluation of sensing modalities for activity recognition. In Proc. of UbiComp'07, pp. 483-500.
Mettler-Meibom, et al. The influence of information and attitudes toward energy conservation on behavior. (Translated by M. Stommel, Michigan State University.). H. Schaefer, ed., Einfluss des Verbraucherverhaltens au den Eneigiebedarf Privater Iiaushalte. Berlin: Springer-Verlag, 1982.
Metz, et al. Climate Change 2007: Mitigation: Contribution of Working Group III to the Fourth Assessment Report of the Intergovernmental Panel on Climate Change. Intergovernmental Panel on Climate Change, 2007. Segment 1 of 3. pp. 1-339.
Metz, et al. Climate Change 2007: Mitigation: Contribution of Working Group III to the Fourth Assessment Report of the Intergovernmental Panel on Climate Change. Intergovernmental Panel on Climate Change, 2007. Segment 2 of 3. pp. 340-602.
Metz, et al. Climate Change 2007: Mitigation: Contribution of Working Group III to the Fourth Assessment Report of the Intergovernmental Panel on Climate Change. Intergovernmental Panel on Climate Change, 2007. Segment 3 of 3. pp. 603-852.
Molina-Markham, et al. Private memoirs of a smart meter. In Proc. of BuildSys'10, pp. 61-66.
Mountain, D., "Summary The Impact of Real-Time Feedback on Residential Electricity Consumption: The Hydro One Pilot," Mar. 2006, 4 pages.
Mountain, D.C., "Price Influences Demand," DeGroote School of Business, McMaster University, Jun. 5, 2008, 16 pages.

"Nest. The Nest Hello video doorbell is here. Website: https://nest.com/. Downloaded Jul. 26, 2018. 4 pages".
Norford, et al. Non-intrusive electrical load monitoring in com¬mercial buildings based on steady-state and transient load-detection algorithms. Energy and Buildings, 24(1):51-64, 1996.
P3 International, "Kill a WattTM Electricity Usage Monitor", Innovative Electronic Solutions, http://www. p3international.com/products/special/P4400/P4400-CE.html, 2008, 1 page.
Parker, D., et al. "Contract Report: Pilot Evaluation of Energy Savings from Residential Energy Demand Feedback Devices," Florida Solar Energy Center, A Research Institute of the University of Central Florida, Jan. 2008, 32 pages.
Patel, et al. "PowerLine Positioning: A Practical Sub-Room-Level Indoor Location System for Domestic Use," In the Proceedings of UbiComp 2006, pp. 441-458, Orange County, CA.
Patel, et al. The Design and Evaluation of an End-user-deployable, Whole House, Contactless Power Consumption Sensor, In Proceedings of the SIG CHI Conference on Human Factors in Computing Systems, CHI '10, pp. 2471-2480, New York, NY, USA, 2010. ACM.
Patel, S.N., "Bringing Sensing to the Masses: An Exploration in Infrastructure-Mediated Sensing" (slides and transcript of presentation), Intel Labs, Apr. 28, 2008, 133 pages, Seattle, Washington.
Patel, S.N., et al. "At the Flick of a Switch: Detecting and Classifying Unique Electrical Events on the Residential Power Line," In the Proceedings of UbiComp 2007, Sep. 16, 2007, pp. 271-288, Innsbruck, Austria.
Patel, S.N., Reynolds, M.S., and Abowd, G.D., "Detecting Human Movement by Differential Air Pressure Sensing in HVAC System Ductwork: An Exploration in Infrastructure Mediated Sensing," In the Proceedings of Pervasive 2008, May 19-22, 2008, pp. 1-18, Sydney, Australia.
Perez. A non-intrusive appliance load monitoring system for identifying kitchen activities. Master Thesis, 2011.
"Philip Lioio, V. Electronic Design. Understanding EMI Noise in Power-System Design. Website: https://www.electronicdesign.com/print/52454. Apr. 24, 2012. 7 pages".
Phillips. Supero : A Sensor System for Unsupervised Residential Power Usage Monitoring.
PlugWise. Plugwise Home Efficiency.
Powers, et al. Using a rule-based algorithm to disaggregate end-use load profiles from premix level data. Computer Applications in Power, 4(2):42-47, Apr. 1991.
Prudenzi, A., "A Neuron Nets Based Procedure for Identifying Domestic Appliances Pattern-of-Use from Energy Recordings at Meter Panel," IEEE, 2002, pp. 941-945, vol. 2.
Reinhardt, et al. On the accuracy of appliance identification based on distributed load metering data. In Proc. of SustainIT'12, pp. 1-9.
"Rozenblat. SMPS Switching Power Supply Topologies: Comparison and Selection. Website: https://www.smps.us/topologies.html. Downloaded Jan. 6, 2011. 3 pages".
Rudin, et al. Nonlinear total variation based noise removal algorithms. Physica D 60. 1-4 (1992), pp. 259-268.
Shaw, et al. Detection and Diagnosis of MAC Faults via Electrical Load Monitoring. HVAC&R Research, 8(1):13-40, 2002.
Shenavar, et al. Novel embedded real-time NIL for electric loads disaggregating and diagnostic. Computing, pp. 1555-1560, 2007.
Silva. Induction Motor Fault Diagnostic and Monitoring Methods. Master Thesis, 2006.
Srinivasan, et al. Neural-Network-Based Signature Recognition for Harmonic Source Identification. Power, 21(1):398-405, 2006.
Tapia, E., et al., "Activity Recognition in the Home Setting Using Simple and Ubiquitous Sensors," Pervasive Computing (Lecture Notes in Computer Science), 2004, pp. 158-175.
Tapia, E., et al. "The Design of a Portable Kit of Wireless Sensors for Naturalistic Data Collection," Proc. of Pervasive 2006, pp. 117-134.
"Tendril. Tendril named a leader in Home Energy Management by Navigant Research. Website: https://www.tendrilinc.com/. 3 pages. Accessed Jul. 26, 2018".
"Tendril. Tendril Volt, Tendril's many energy tools (photos)—CNET—p. 4. Accessed Jul. 26, 2018. 2 pages".

(56) References Cited

OTHER PUBLICATIONS

Thomaz, et al. Recognizing water-based activities in the home through infrastructure-mediated sensing. In Proc. of UbiComp'12, pp. 85-94.
Thomson, et al. Current signature analysis to detect induction motor faults. Industry Applications Magazine, IEEE, 7(4):26-34, 2001.
"Transparency Market Research. Global Home Energy Management Systems (HEMS) Market to Grow at Exponential CAGR of 25% till 2019 due to Rising Demand for Energy Conservation. Website: https://www.transparencymarketresearch.com/pressrelease/home-energy-management-systems.htm. Published online: Sep. 2015. 3 pages".
"Study Finds Elder Care a Growing Emotional and Financial Burden for Baby Boomers," New ADT monitoring service for elderly helps ease the stress of long distance care giving, PR Newswire Europe, Mar. 29, 2005, 4 pages.
Ueno, T., et al. "Effectiveness of Displaying Energy Consumption Data in Residential Houses—Analysis on How the Residents Respond," ECEEE 2005 Summer Study—What Works and Who Delivers?, May-Jun. 2005, pp. 1289-1299, France.
"Who website. Electromagnetic fields (EMF) What are electromagnetic fields? Website: https://www.who.int/peh-emf/about/WhatisEMF/en/index3.html. Downloade May 30, 2018. 7 pages".
"Wikipedia webiste. Opower. 2 pages. Accssed on Jul. 26, 2018".
Wilson, D., et al. "Simultaneous Tracking and Activity Recognition (STAR) Using Many Anonymous, Binary Sensors," In the Proceedings of Pervasive 2005, pp. 62-79.
Zeifman, et al. Nonintrusive appliance load monitoring: Review and outlook. IEEE Transactions on Consumer Electronics 57, 1 (2011), pp. 76-84.
Zimmerman, et al. Applying Electric Field Sensing to Human-Computer Interfaces. Human. Factors, May 1995.
Zouba, et al. Monitoring Activities of Daily Living (ADLs) of Elderly Based on 3D Key Human Postures. In Proc. of ICVW'08, pp. 37-50.
English Translation of First Office Action for Japanese Application No. 2017-510525 dated Aug. 23, 2019.
JP Office Action for Application No. 2017-510525, dated Jan. 20, 2020.

* cited by examiner

DETECTING USER-DRIVEN OPERATING STATES OF ELECTRONIC DEVICES FROM A SINGLE SENSING POINT

CROSS-REFERENCE TO RELATED APPLICATIONS

This application is a U.S. National Phase Application under 35 U.S.C. § 371 of International Application No. PCT/US2015/048617, filed Sep. 4, 2015, which claims the benefit of U.S. Provisional Application No. 62/046,037, filed Sep. 4, 2014, and U.S. Provisional Application No. 62/085,080, filed Nov. 26, 2014. International Application No. PCT/US2015/048617 and U.S. Provisional Application Nos. 62/046,037 and 62/085,080 are incorporated herein by reference in their entirety.

TECHNICAL FIELD

This disclosure relates generally to sensing electronic devices, and relates more particularly to detecting operating states of electronic devices.

BACKGROUND

Many current approaches for detecting and classifying electrical appliance use employ a distributed model wherein each electrical device has a dedicated sensor, which looks for changes in the device's state (e.g., the turning-on and turning-off of the device). Device level sensing generally requires time-consuming and expensive installation and maintenance. Indirect sensing techniques also have been used where microphones, accelerometers, and video cameras are placed throughout a structure to detect electrical appliance activity. Such techniques generally require costly installation and maintenance and also may raise privacy concerns in a home setting. Techniques for sensing the presence of electronic devices from a single sensing point based on electromagnetic interference produced by electronic devices generally can detect the on- or off-state of electronic devices.

BRIEF DESCRIPTION OF THE DRAWINGS

To facilitate further description of the embodiments, the following drawings are provided in which.

Figure 1:
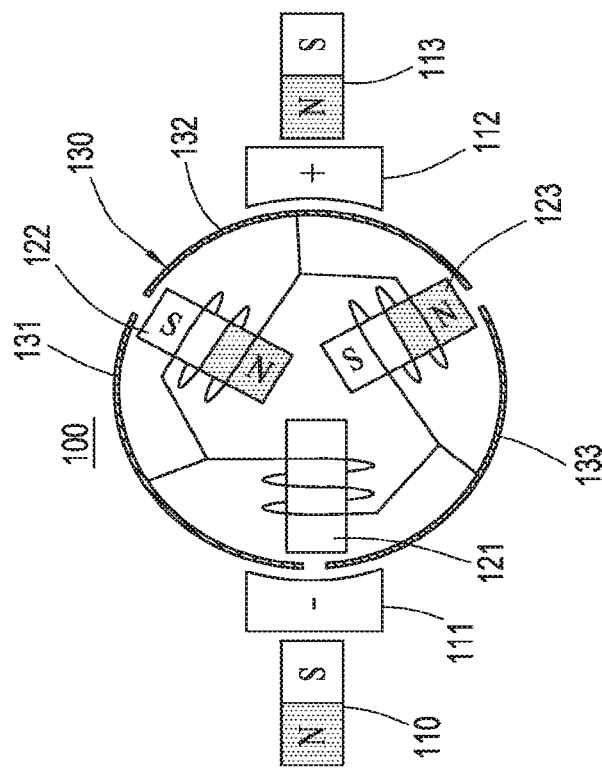
FIG. 1 illustrates a schematic view of a motor with a commutator in a first rotational orientation.

For simplicity and clarity of illustration, the drawing figures illustrate the general manner of construction, and descriptions and details of well-known features and techniques may be omitted to avoid unnecessarily obscuring the present disclosure. Additionally, elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein.

The terms "couple," "coupled," "couples," "coupling," and the like should be broadly understood and refer to connecting two or more elements mechanically and/or otherwise. Two or more electrical elements may be electrically coupled together, but not be mechanically or otherwise coupled together. Coupling may be for any length of time, e.g., permanent or semi-permanent or only for an instant. "Electrical coupling" and the like should be broadly understood and include electrical coupling of all types. The absence of the word "removably," "removable," and the like near the word "coupled," and the like does not mean that the coupling, etc. in question is or is not removable.

As defined herein, two or more elements are "integral" if they are comprised of the same piece of material. As defined herein, two or more elements are "non-integral" if each is comprised of a different piece of material.

As defined herein, "approximately" can, in some embodiments, mean within plus or minus ten percent of the stated value. In other embodiments, "approximately" can mean within plus or minus five percent of the stated value. In further embodiments, "approximately" can mean within plus or minus three percent of the stated value. In yet other embodiments, "approximately" can mean within plus or minus one percent of the stated value.

DESCRIPTION OF EXAMPLES OF EMBODIMENTS

Various embodiments include an apparatus including a sensing device configured to be coupled to an electrical outlet. The sensing device can include a data acquisition receiver configured to receive electrical noise via the electrical outlet when the sensing device is coupled to the electrical outlet. The electrical outlet can be electrically coupled to an electrical power infrastructure. One or more electrical devices can be coupled to the electrical power infrastructure and can generate at least a portion of the electrical noise on the electrical power infrastructure. The data acquisition receiver can be configured to convert the electrical noise into one or more first data signals. The apparatus also can include a processing module configured to run on a processor of a computational unit. The sensing device can be in communication with the computational unit. The processing module can be further configured to identify each of two or more operating states of each of the one or more electrical devices at least in part using the one or more first data signals. The two or more operating states of each electrical device of the one or more electrical devices can be each different user-driven operating states of the electrical device when the electrical device is in an on-power state.

A number of embodiments include a method including capturing, at a sensing device coupled to an electrical outlet, electrical noise via the electrical outlet. The electrical outlet can be coupled to an electrical power infrastructure. One or more electrical devices can be coupled to the electrical power infrastructure and can generate at least a portion of the electrical noise on the electrical power infrastructure. The method also can include converting, at the sensing device, the electrical noise into one or more first data signals.

The method additionally can include transmitting the one or more first data signals from the sensing device to a computational unit. The method further can include identifying, at a processing module of the computational unit, each of two or more operating states of each of the one or more electrical devices at least in part using the one or more first data signals. The two or more operating states of each electrical device of the one or more electrical devices can be each different user-driven operating states of the electrical device when the electrical device is in an on-power state.

Electrical power on electrical power lines can include electrical noise. The electrical noise present on an electrical power infrastructure can be caused by the operation of an electrical device, which is electrically coupled to the electrical power infrastructure. This type of electrical noise is called Electromagnetic Interference (EMI). EMI can be classified into two types: transient noise and continuous noise. In some embodiments, continuous or transient electrical noise that occurs at the time when an electrical device is turned on is not the same shape of the electrical noise after a few alternating current electrical cycles (e.g., one alternating current electrical cycle is $1/60$th of a second in the United States). For example, the electrical noise of a compact fluorescent light bulb (CFL) has one shape for a few alternating current electrical cycles while the CFL is warming up and then the shape of the electrical noises changes to second shape after the CFL is warmed-up. In another example, DC (direct current) motors have a continuous noise but the continuous noise of the DC motor can only last microseconds but can repeat every alternating current electrical cycle while the DC motor is running.

Transient noise is characterized by the short duration for which it can be observed, generally tens of nanoseconds to a few milliseconds. Continuous noise (i.e., substantially continuous noise), on the other hand, can be observed for as long as the electrical device is operational. In many embodiments, "continuous noise," as used herein, can mean repetitive, continual, uninterrupted, or repeated noise. In the same or different embodiments, noise can be continuous if a pattern in the noise is repeated every alternating current cycle or if an electrical noise signal is observed without cessation while the electrical device is operation. Noise can be still considered continuous noise if a one alternating current cycle break occurs in the noise.

In several examples, continuous electrical noise can be identifiable on the electrical power line for a length of time greater than one alternating current electrical cycle. In another example, continuous electrical noise can be identifiable for a length of time that is less than one alternating current cycle but the electrical signals are repeated in three or more alternating current electrical cycles. In another example, continuous electrical noise can be electrical signals that are identifiable on the electrical power line for a length of time greater than approximately ten milliseconds. In another example, continuous electrical noise can be electrical signals that are identifiable on the electrical power line for a length of time greater than approximately fifty milliseconds. In still other examples, continuous electrical noise can be electrical signals that are identifiable on the electrical power line for a length of time greater than approximately one second. In yet further examples, continuous electrical noise can be electrical signals that are identifiable on the electrical power line for a length of time greater than approximately ten seconds.

Both transient and continuous noise can either be concentrated within a narrow frequency band or spread over a wider bandwidth (i.e., broadband noise). A CFL is an example of an electrical device that generates continuous noise, which is conducted over the electrical power line due to its electrical coupling with the electrical power line infrastructure. Because a structure's electrical distribution system is interconnected in parallel at the structure's circuit breaker panel, conducted EMI propagates widely from a given electrical device throughout the electrical line infrastructure of the structure.

Electricity and appliance usage information can often reveal the nature of human activities in a home. For instance, sensing the use of a vacuum cleaner, a microwave oven, and kitchen appliances can give insights into a person's current activities. Instead of putting a sensor on each appliance, sensing techniques can be based on the idea that appliance usage can be sensed by their manifestations in an environment's existing electrical power infrastructure. Other approaches that sense EMI generally only detect an appliance's on- or off-states, which allows for detecting what appliances are being used, but not how the appliances are being used.

In a number of embodiments, the systems and method described herein can be used to infer operating states of electronic devices from a single sensing point in a structure, such as a house. When an electronic device is in operation, it generates Electromagnetic Interference (EMI) that is time-varying based upon its operating states (e.g., vacuuming on a rug vs. hardwood floor). This EMI noise is coupled to the power line and can be detected from a single sensing hardware attached to the wall outlet in the structure (e.g., the house). In a number of embodiments, domain knowledge of the device's circuitry can be used for semi-supervised model training to avoid tedious labeling process.

The ability to sense, model, and infer human activity in the physical world remains an important challenge in pervasive computing. Infrastructure-mediated sensing (IMS) has been proposed as one method for low-cost and unobtrusive sensing of human activities. IMS is based on the idea that human activities (e.g., vacuuming, using the microwave, or blending a drink) can be sensed by their manifestations in an environment's existing infrastructures (e.g., a home's water, electrical, and HVAC infrastructures), thereby reducing the need for installing sensors everywhere in an environment. An example of IMS is the ability to detect electrical activation or deactivation events using a single plug-in sensor by fingerprinting the transient electrical noise signatures on the power line. This technique was improved utilizing the EMI produced by modern electronic devices in the home. From a single sensing point, the presence of electronic devices can be inferred by training on the frequency domain EMI signatures of those devices. These techniques generally can detect only the on- or off-state of electronic devices.

Continuous time-varying EMI can provide additional information on how a device is being used and what state the device might be in, providing more granular information for activity recognition and energy disaggregation. In a number of embodiments, the systems and methods described herein can be different from Gaussian fitting and supervised learning, and instead can leverage domain knowledge of the device's circuitry for semi-supervised learning, reducing efforts for training the classifier. In many embodiments, the systems and methods described herein can detect the operating states of electronic devices through a single-sensing point, which can be installed anywhere in a structure (e.g., a house). The systems and methods described herein can leverage electrical noise for estimating the operating states of appliances. Electronic devices can yield EMI when they are in operation. When an electronic device operates at different states (e.g., high vs. low CPU loads) or under varying conditions (e.g., using vacuum cleaner on rug vs. hardwood floor), the EMI generated by the electronic device fluctuates distinctively based on the corresponding user-driven operating states. In many embodiments, various different operating states of an electronic appliance can be identified based on the time-varying EMI. Domain knowledge of the electronic device's circuit model and semi-supervised clustering can be used for state estimation, which can obviate the need for a tedious labeling process on the data. This usage of domain knowledge as a prior for model training can significantly reduce training efforts, as it does not require huge amounts of labeled data. In many embodiments, unlike techniques that focus on static continuous EMI, such as static SMPS-based EMI for electrical activation or deactivation event detection, time-varying EMI induced by mechanically switching (e.g., vacuum cleaner), electronically switching (e.g., laptop), and the combination (e.g., hair dryer) circuits can be used to detect operating states of the electronic devices.

Detecting and identifying the operating states of electronic appliances can be beneficial to a variety of applications. For instance, these fine-grained electrical characteristics can provide richer feature sets than static features used in prior techniques that focus on static continuous EMI for electrical activation or deactivation event detection, and can be employed to achieve accurate energy disaggregation. In addition, the state changes in electrical characteristics can be indicative of human behaviors and can be used in activity-inference detection. For example, two residents of a home could use the hair dryer very differently. By detecting the operating states in their respective usage patterns, the systems and methods described herein can identify energy usage attributed to different individuals. Additionally, the systems and methods described herein also can be used for machine failure discovery by observing changes in known states or detecting the presence of a new, abnormal operating state. Detecting the states can be an important step to realizing these applications.

Types of Time-Varying EMI

Various types of EMI in the form of continuous noise can be produced by appliances based on their operation and internal electronics. Various types of time-varying EMI can be generated by the appliances based on changes in the internal operating state of the appliance or based on different physical uses of the appliance.

A. EMI for Motor-Based Appliances

Figure 2:
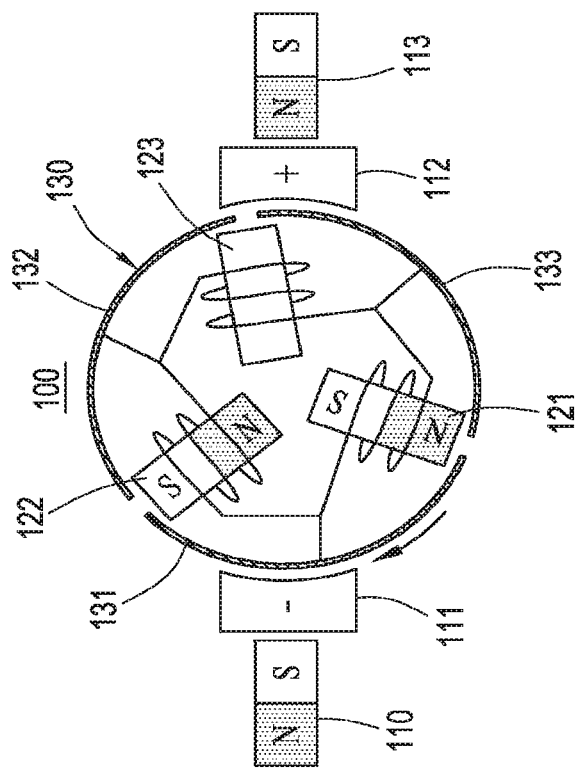
FIG. 2 illustrates a schematic view of the motor of FIG. 1 with the commutator of FIG. 1 in a second rotational orientation.

A variety of home appliances use motors, such as vacuum cleaners, blenders, and food mixers. Commutator motors are energy efficient because they yield high rotational speed with relatively low power consumption. However, due to a mechanical switching mechanism between the brushes and commutator, they typically generate strong EMI. FIG. 1 illustrates a schematic view of a motor 100 with a commutator 130 in a first rotational orientation. FIG. 2 illustrates a schematic view of motor 100 with commutator 130 in a second rotational orientation. Motor 100 can be a three-slot, two-pole brushed motor. Motor 100 can include a commutator 130 having three commutator slots 131, 132, and 133. Motor 100 also can include three electromagnets 121, 122, and 123, each of which can be an iron bar that can be made to have two poles (e.g., north and south), which can be turned on or off, or switched, based on the flow of electricity around the iron bar. Two brushes 111 (positive circuit polarity) and 112 (negative circuit polarity) can be used to supply electric currents to the circuitry via commutator slots (e.g., 131-133). When motor 100 is in operation, electric currents from commutators slots (e.g., 131-133), which were supplied by the brushes (e.g., 111, 112), can induce magnetic fields in the electromagnets (121-123). In FIG. 1, electromagnet 123 does not form any magnetic field as there is no current flowing through it. Motor 100 can include two permanent magnets 110 and 113 on each side to generate rotation forces. In FIG. 1, electromagnet 121 is attracted by the permanent magnet 110 while electromagnet 122 is repelled from permanent magnet 110, generating a clockwise force to commutator 130. The breaking and making of contacts between commutator slots 131-133 and brushes 111 and 112 causes poles of the conducted electromagnets (121-123) to switch, forcing commutator 130 to consistently rotate clockwise. For example, as shown in FIG. 2, electromagnet 121 does not form any magnetic field, as there is no current flowing through it. Electromagnet 122 is attracted to permanent magnet 113 and electromagnet 123 is repelled by permanent magnet 113, making commutator 130 consistently rotate clockwise, and generating EMI when the commutator slots (e.g., 131-133) break and make contact between the brushes (e.g., 111-112). High-efficiency motors typically have more commutator slots, such as 21-25 commutator slots, as well as additional brushes, which can yield a stronger torque.

1. Commutating EMI Due to Mechanical Switching

Figure 3:
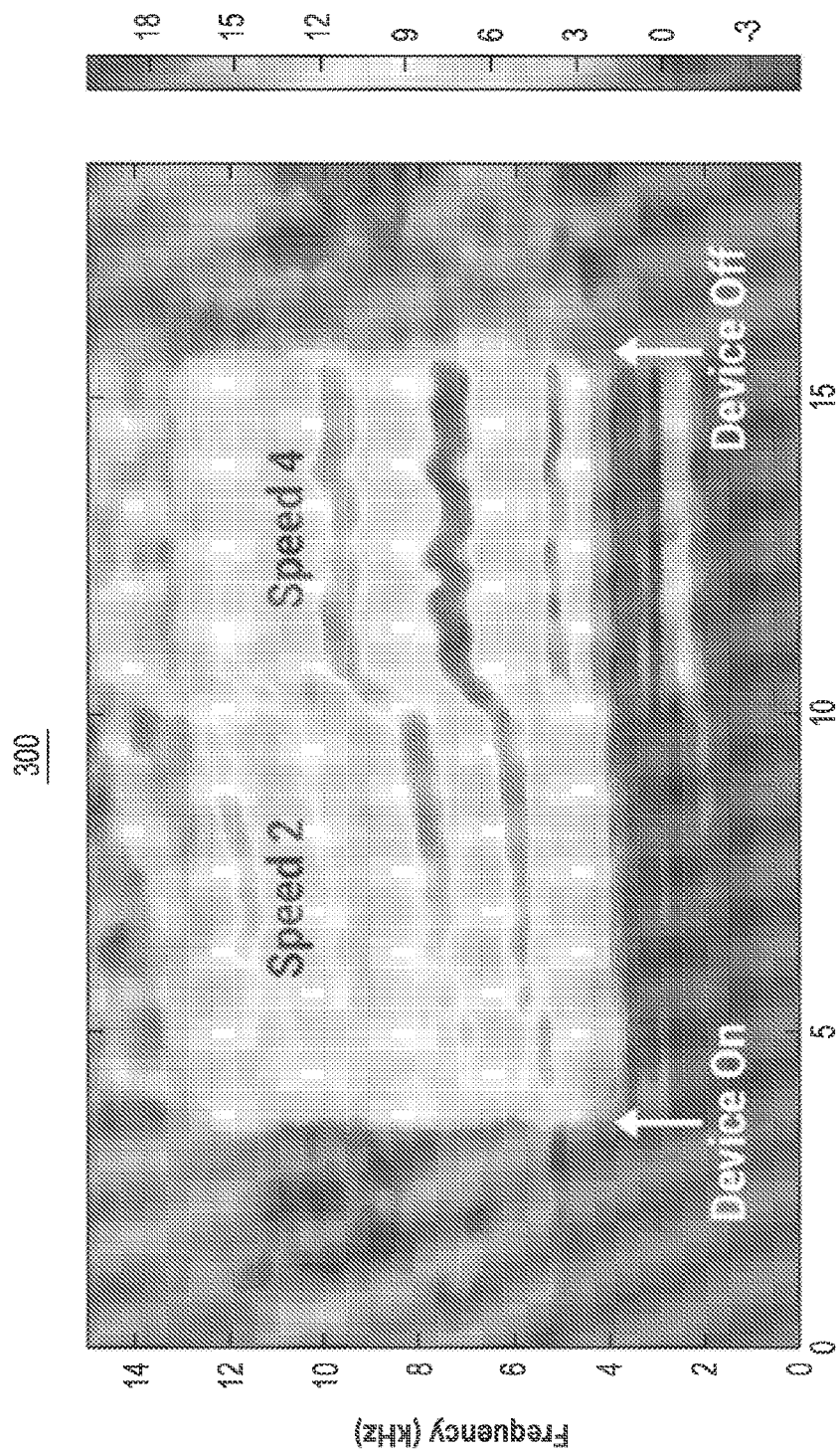
FIG. 3 illustrates a time-frequency representation of fluctuating EMI when a blender having a motor operates at different speeds.
Figure 4:
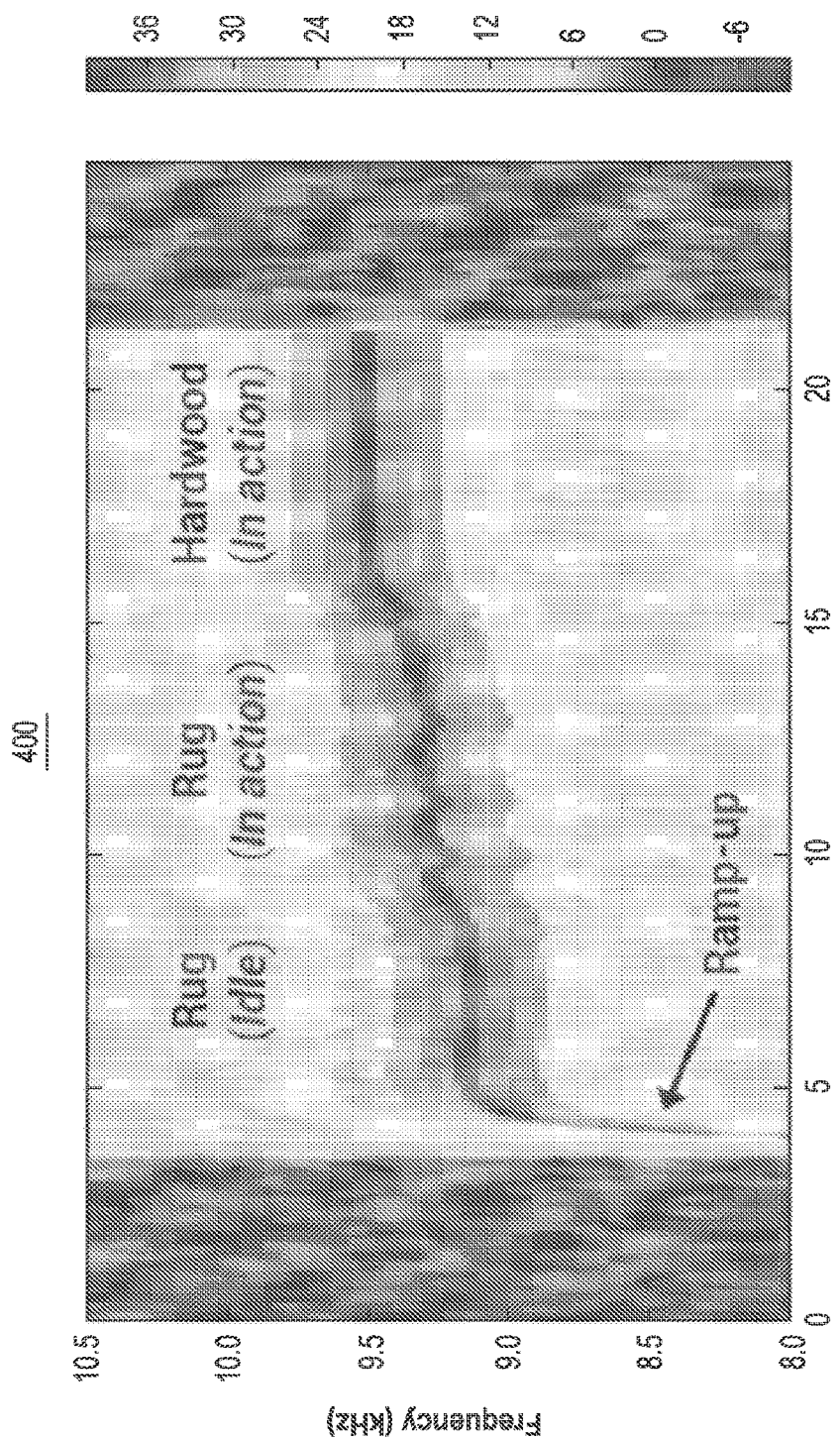
FIG. 4 illustrates a time-frequency representation of fluctuating EMI when a vacuum cleaner was used on the rug and hardwood floor of a home.

Motor EMI is caused by the mechanical switching phenomena. As the motor rotates, the action of breaking and making contacts between the commutator (e.g., 130) and brushes (e.g., 111, 112) yields periodic current spikes at the motor's rotation rate multiplied by the number of commutator slots. That is, the EMI appears at the harmonics of the motor's rotation speed. For example, a motor with 21 slots and a rotation rate of 460 RPS (revolutions per second) yields current spikes at 21*460=9660 Hz (Hertz), which manifests itself as EMI of the same frequency. This type of EMI, called commutating EMI, propagates mainly through conduction over the power line network, and also yields a small amount of radiated emissions. When the motor is turned on, it takes one to two seconds to reach the specified operating speed. This speed-up duration appears as a "ramp-up" EMI, as shown in FIGS. 3 and 4, described below. In addition, there exists electrical resistance between the brush-commutator terminals. These impedances affect motor rotations, causing relatively weaker EMI near the fundamental frequency. In many embodiments, these EMI can be detected and leveraged as features for estimating operating states of a motor.

2. Time-Varying EMI at Different Rotation Speeds

Commutating EMI appears at the harmonics of the motor's rotation rate. When the motor operates at a different speed, the EMI in turn appears at distinct frequencies. FIG. 3 illustrates a time-frequency representation 300 of fluctuating EMI when a blender, specifically, a Cuisinart PowerBlend600, having a motor, which can be similar to motor 100 (FIGS. 1-2), operates at different speeds. After the blender turns on at the time of approximately 4 seconds (s), for a first duration, at the time of approximately 5 s to 10 s, in FIG. 3, the blender was running at a relatively low speed (Speed 2), yielding EMI at roughly 6 kHz (kilohertz). When it switches to a higher speed (Speed 4) for a second duration, at the time of approximately 10 s to 15 s in FIG. 3, the EMI frequency ramps up to 7.1 kHz as the motor's rotation rate increases, before the blender is turned off at the time of approximately 16 s.

3. Time-Varying EMI in Response to Physical Use

It is observed that when the blender motor spins at a higher speed, water within the blender container is vigorously stirred, causing air pockets and liquid to collide randomly with the blades. This uneven air/liquid resistance can cause the blender speed to fluctuate, thus resulting in the irregular fluctuating EMI, as visible in the Speed 4 section of FIG. 3. Time-varying EMI patterns also can be observed when a vacuum is used on different surfaces. FIG. 4 illustrates a time-frequency representation 400 of fluctuating EMI when a vacuum cleaner, specifically, a Bissel 6584, was used on the rug and hardwood floor of a home. In a vacuum cleaner, the motor spins to exhaust the air from the machine, making the dust collection container a temporary vacuum. To balance the pressure, the air outside the cleaner flows into the container and then releases from the motor vent. This air circulation sucks the dusts into the machine and releases the air from the machine. When being used on the rug, the motor rotates at a lower, uneven speed due to the disturbed airflows by the rug. The reduction and disturbance in motor rotations yield an EMI that fluctuates at a relatively low frequency, as shown at the time of approximately 5 s to 15 s in FIG. 4, which occurs after a ramp-up duration at the time of approximately 4 s to 5 s. As shown in FIG. 4, the EMI produced when the vacuum is idle on the rug (at the time of approximately 5 s to 9 s) can be different than the EMI produced when the vacuum is used in action on the rug (at the time of approximately 9 s to 15 s). Once the vacuum cleaner moves to a hardwood floor, the air intake becomes largely unhindered yielding static EMI at a higher frequency, as shown at the time of approximately 16 s to 21 s in FIG. 4.

B. EMI for SMPS-Based Appliances

Figure 5:
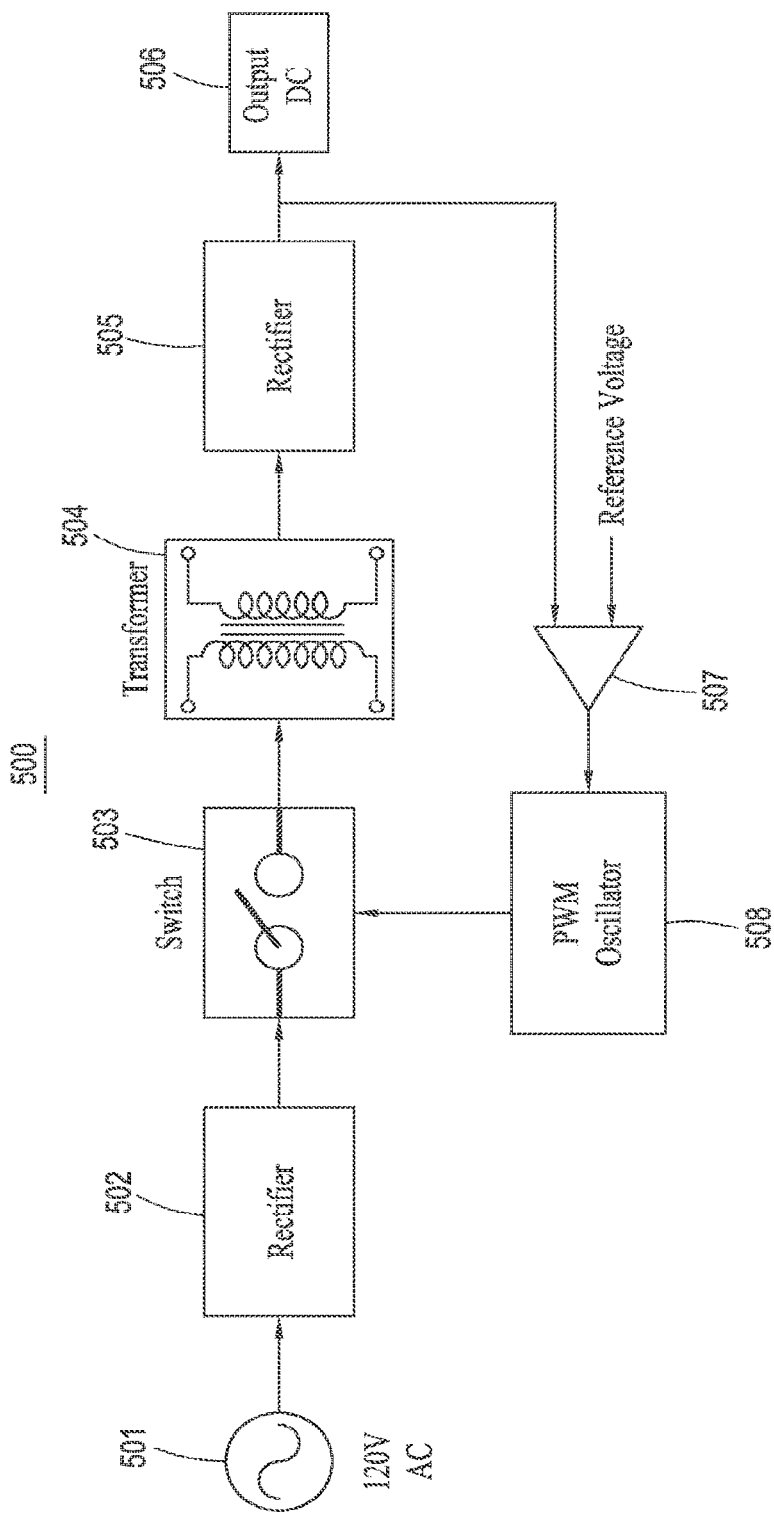
FIG. 5 illustrates a block diagram of a switched-mode power supply (SMPS)

The SMPS (switched-mode power supply) has been extensively used in modern electronic appliances due to its small size and high efficiency. Unlike the traditional linear power supply, the SMPS manages power by switching the supply between complete-on, complete-off, and low dissipation. Because the power supply operates at high dissipation only for a very short period, it minimizes wasted power. FIG. 5 illustrates a block diagram of an SMPS 500. SMPS can take an alternating current input 501 and produce a direct current output 506. SMPS 500 can include an input rectifier 502, a switch 503, a transformer 504, an output rectifier 505, a comparator 507, and a pulse-width-modulation (PWM) oscillator 508. In many embodiments, switch 503 can include a pass transistor that controls the frequency of switching, based on the PWM oscillator 508. To reduce the size of the supply, SMPS 500 can operate from tens to hundreds of kilohertz. This switching action inherently generates strong EMI near the frequency at which SMPS 500 switches between different modes, known as the switching frequency. In many embodiments, time-varying EMI produced by an SMPS (e.g., 500) can be analyzed to discover operating states of SMPS-based appliances such as laptops and televisions (TVs).

1. Time-Varying EMI at Different CPU Loads

Figure 6:
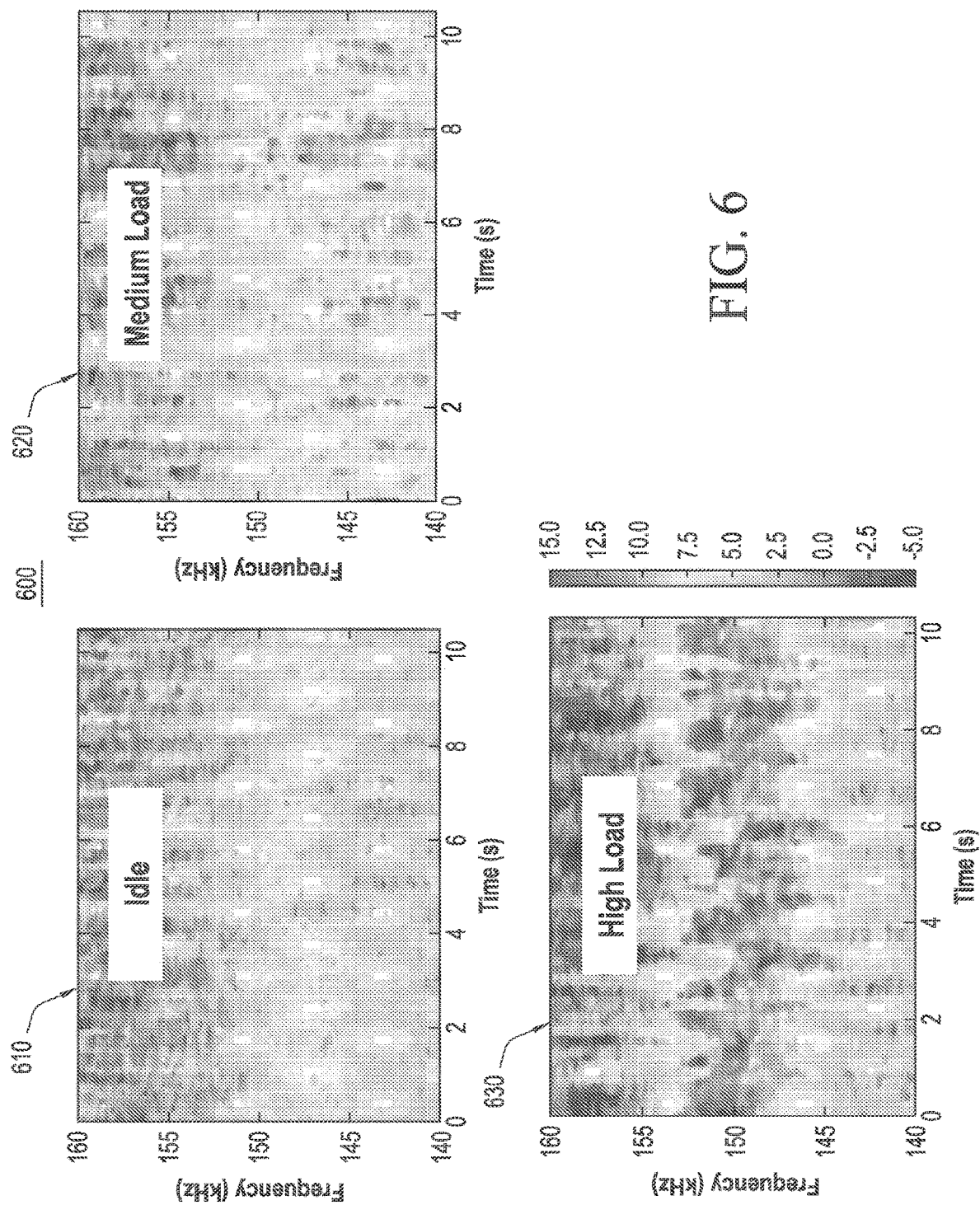
FIG. 6 illustrates time-frequency representations of time-varying EMI of a laptop with its central processing units (CPUs) operating at idle, medium, and high load.

In an SMPS (e.g., 500), output voltage regulation is accomplished by adjusting the ratio of on- and off-durations. As shown in FIG. 5, direct current output 506 is compared with a reference voltage by comparator 507 to adjust switching frequency of PWM oscillator 508. Electronic appliances with varying loads such as laptops can cause EMI fluctuations near its switching frequency. FIG. 6 illustrates time-frequency representations 700 of time-varying EMI of a laptop, specifically, an Acer Aspire 5736Z, with its central processing units (CPUs) operating at idle (shown in a time-frequency representation 610), medium (shown in a time-frequency representation 620), and high load (shown in a time-frequency representation 630). When the CPUs are running at a high load, such as 90-100%, the dropping output voltage causes the oscillator to operate at a higher frequency to draw more energy, yielding the EMI at higher frequency and magnitude, as shown in time-frequency representation 630. In the other two modes, for idle and medium loads, there is relatively weaker, but still discernible, EMI, as shown in time-frequency representations 610 and 620. The signal patterns are distinct on different laptops and personal computers (PCs), which can be attributed to manufacturer differences in power regulation circuitry. In many embodiments, these unique fingerprints between different computers can be used for manufacturer identification or abnormal detection, such as detecting large power draws that may indicate an impending device failure, such as a malfunctioning video card.

2. Time-Varying EMI Caused by Transient Actions

Figure 7:
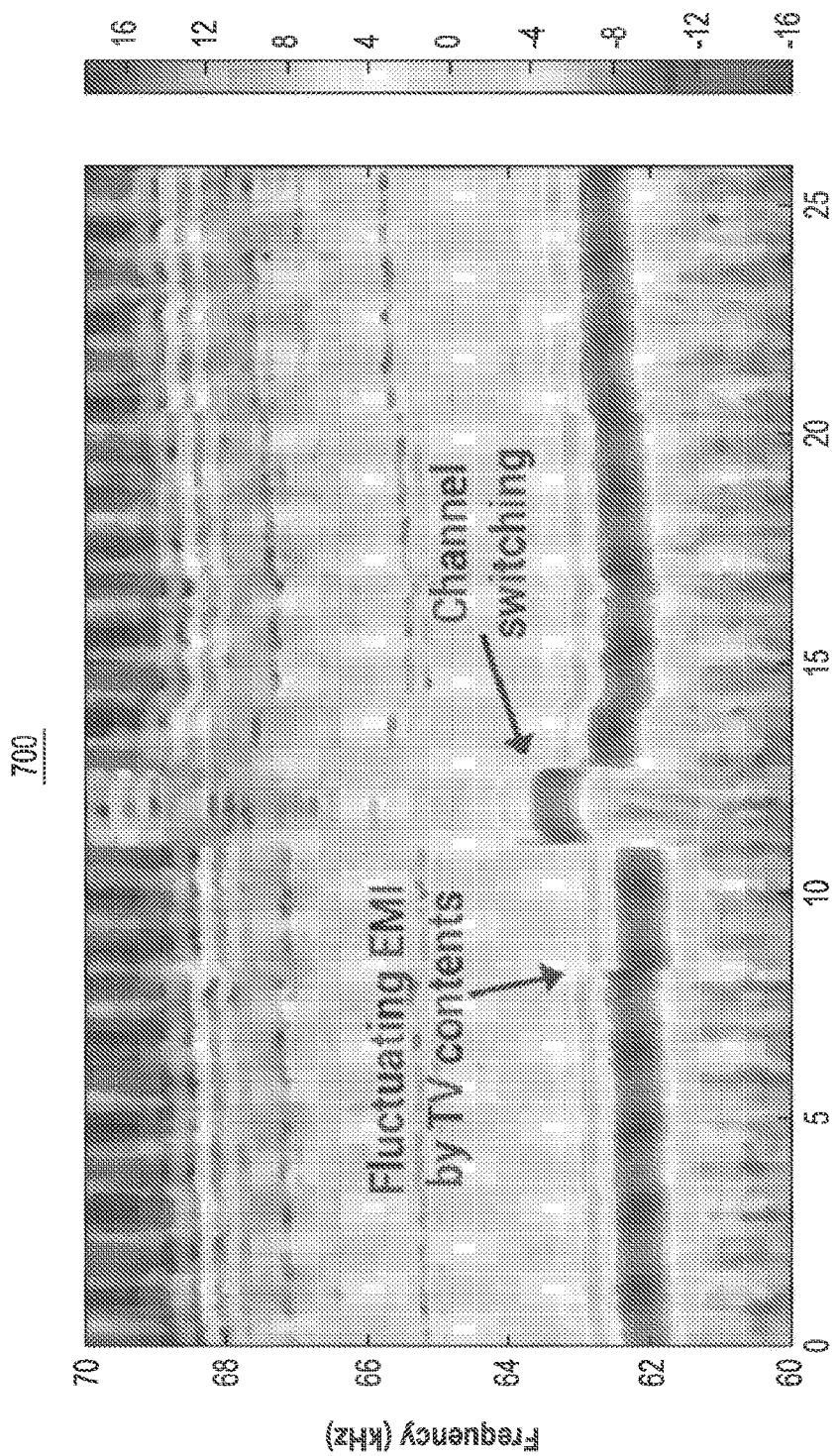
FIG. 7 illustrates a time-frequency representation of an EMI signal of a TV when it is switched from one channel to another.

Another type of time-varying EMI that is caused by transient actions such as switching a TV channel. FIG. 7 illustrates a time-frequency representation 700 of an EMI signal of a TV, specifically, a Sharp 42-inch TV, when it is switched from one channel to another. As shown in FIG. 7, a glitch, or sudden change in EMI, at the time of approximately 11 s to 13 s, is detected when the channel-change action was performed. Further investigation of the TV tuner's circuitry and operation reveals that when a TV switches to a new channel, the TV tuner resets the center frequency, which causes the oscillator to operate at a different frequency for a short period. TVs produce varying EMI signals that correlate to the screen content being displayed. The EMI change from a channel switch is distinct from EMI change as a result of screen content. Due to its large transient nature, in many embodiments, it can be robustly detected and extracted.

C. EMI for Appliances with Large Resistive Loads

Certain appliances, such as hair dryers and fan heaters, employ not only motors, but also large resistive components to generate a stream of hot air. When the device is running in different modes (e.g., cool vs. warm vs. hot), changes in resistive loads affect the motor operation and result in discernible EMI patterns for state estimation. Other appliances that also have other components affecting motor operation, such as a torque screwdriver, can also display such discernable EMI patterns.

Figure 8:
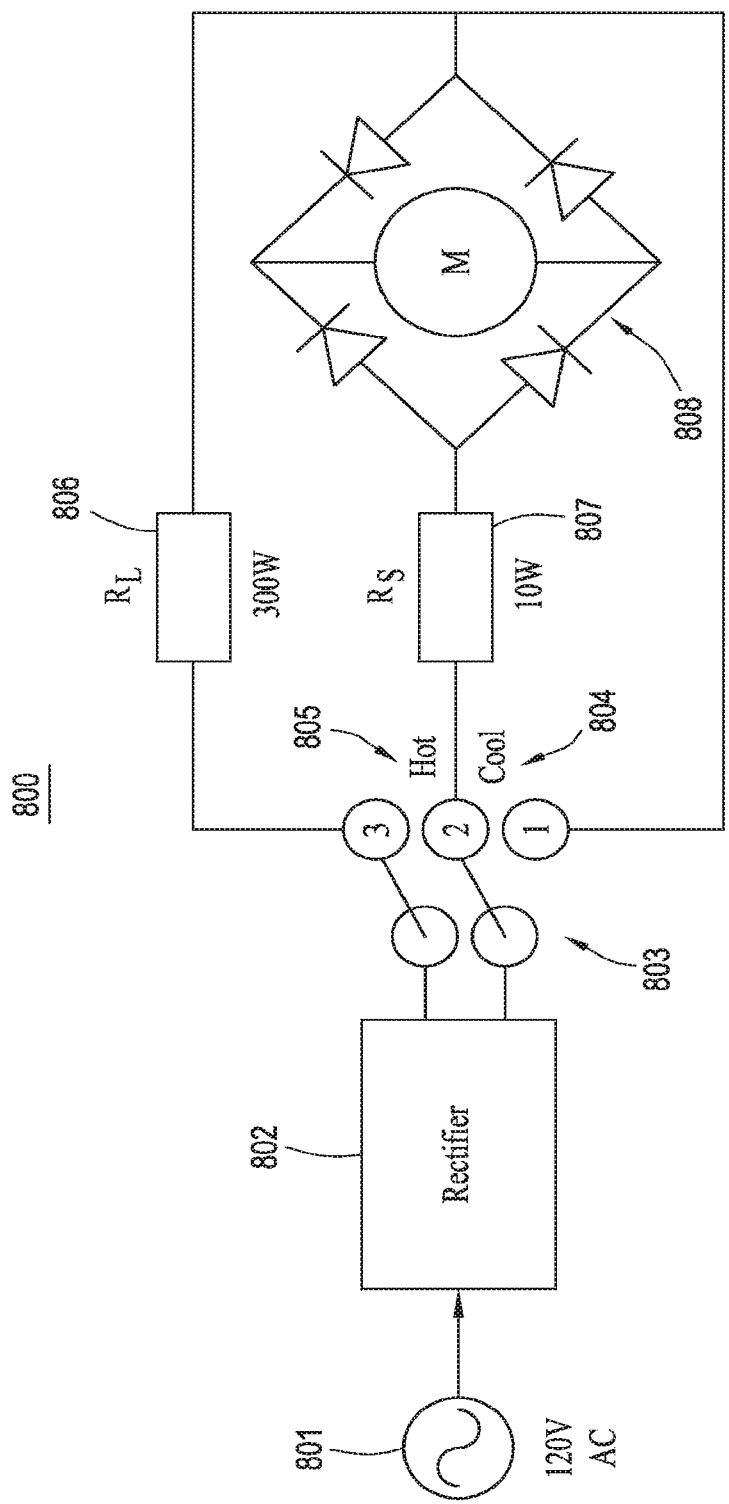
FIG. 8 illustrates a simplified schematic view of a hair dryer that has two modes, one for generating hot air (i.e., hot mode), and one for generating cool air (i.e., cool mode)

FIG. 8 illustrates a simplified schematic view of a hair dryer 800 that has two modes, one for generating hot air (i.e., hot mode), and one for generating cool air (i.e., cool mode). Hair dryer 800 can include a rectifier 802, which can rectify an AC source 801 to DC current. Hair dryer can include a switch 803, which can be switched to a first position 804 for the cool mode, or a second position 805 for the hot mode. When hair dryer 800 operates at the cool mode with switch 803 at first position 804 by making contacts at terminals 1 and 2, only a small resistive load 807 ($R_S$) and a motor-driven fan 808 are actuated. For example, small resistive load 807 ($R_S$) can be a 10 Watt (W) power-rated resistor. When switch 803 is switches to hot mode by making contact at terminals 2 and 3, a large resistive load 806 ($R_L$) is in parallel with small resistive load 807 ($R_S$), which increases the total current load to the circuitry and changes the fan's rotation speed. For example, small resistive load 806 ($R_L$) can be a 300 W power-rated resistor. These behavior changes induce distinct EMI patterns at respective operating states.

Figure 9:
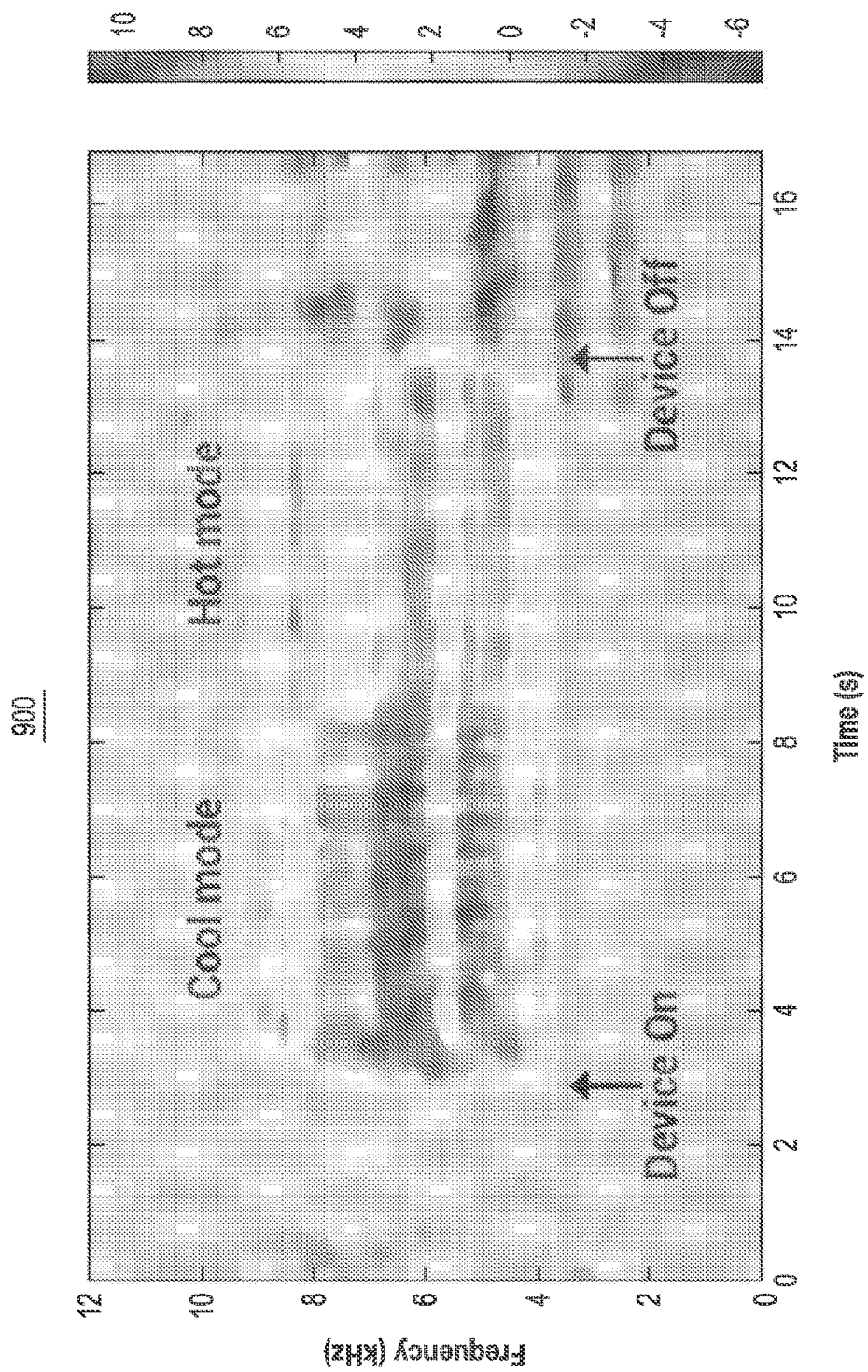
FIG. 9 illustrates a time-frequency representation of time-varying EMI when a hair dryer switches from the cool mode to the hot mode.

FIG. 9 illustrates a time-frequency representation 900 of time-varying EMI when a hair dryer switches from the cool mode to the hot mode. As shown in FIG. 9, after hair dryer 800 is turned on at the time of approximately 3 s, hair dryer 800 operated in the cool mode at the time of approximately 3 s to 8 s, producing a first EMI pattern, and then in hot mode at the time of approximately 8 s to 13 s, producing a different, second EMI pattern, after which hair dryer 800 is turned off at the time of approximately 13 s.

Electrical Operating State Detection Device

Figure 10:
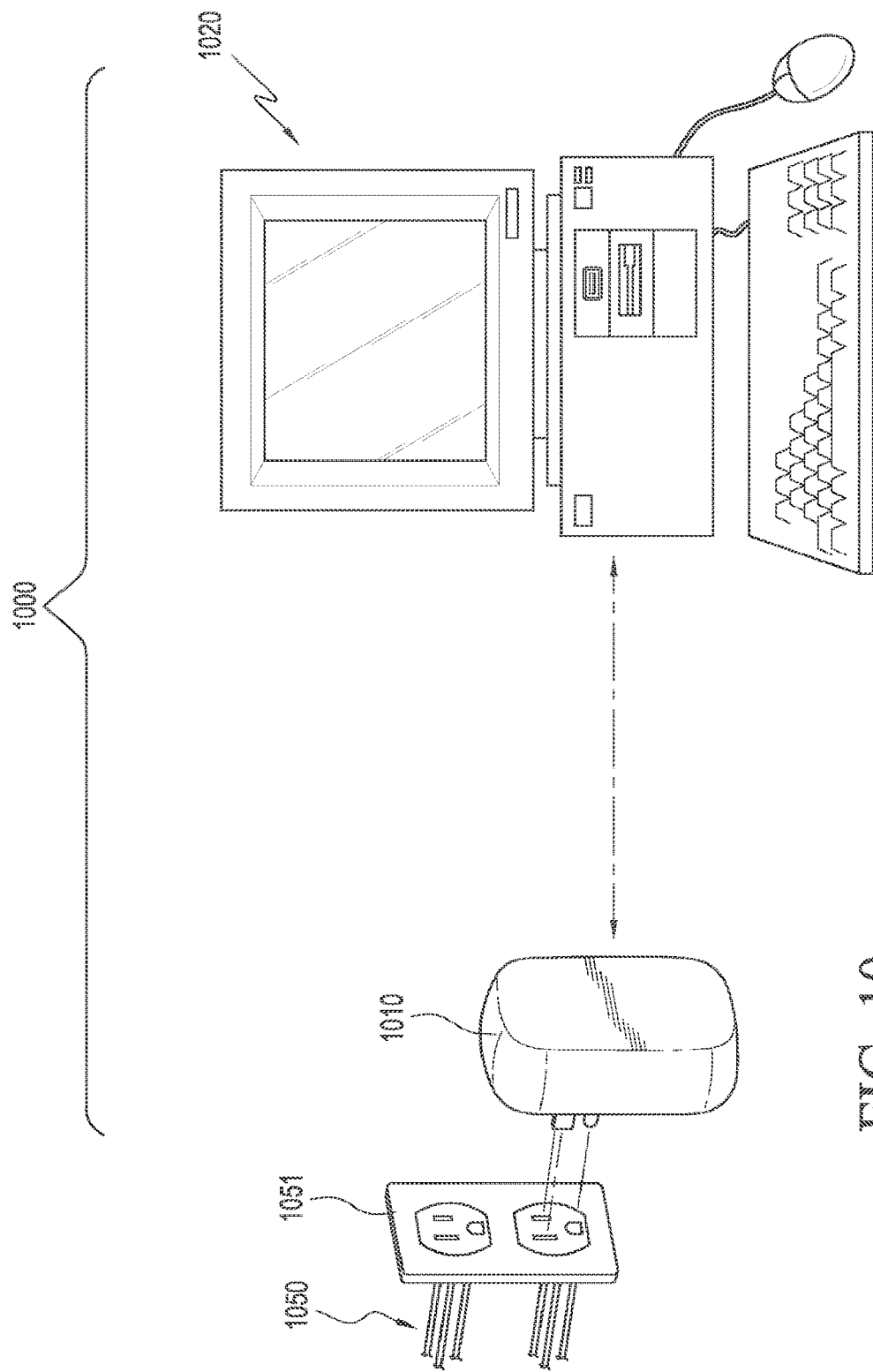
FIG. 10 illustrates a diagram of an exemplary electrical operating state detection device 1000, according to a first embodiment.
Figure 11:
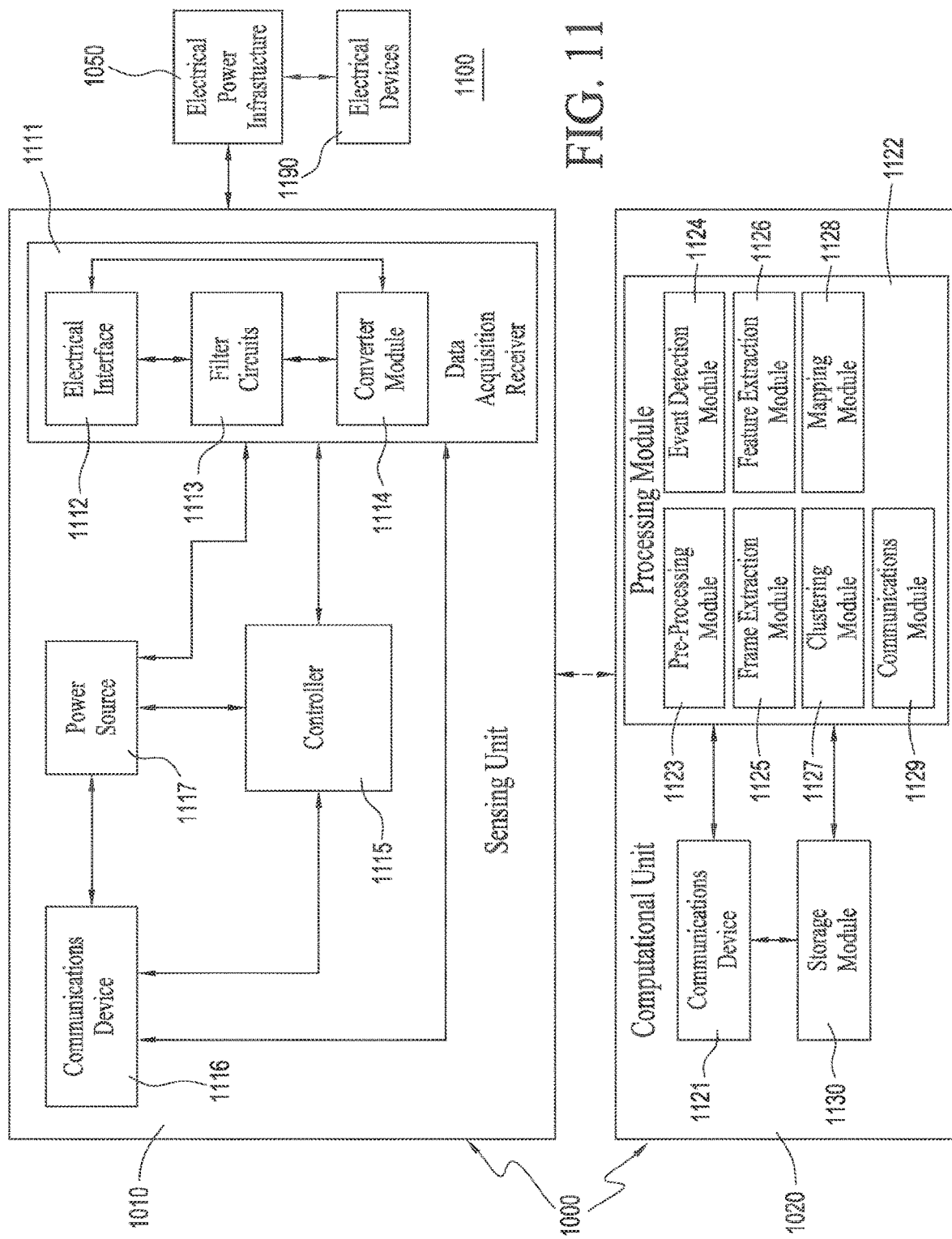
FIG. 11 illustrates a block view of an exemplary system including the electrical operating state detection device of FIG. 10, according to the first embodiment.

Turning ahead in the drawings, FIG. 10 illustrates a diagram of an exemplary electrical operating state detection device 1000, according to a first embodiment. FIG. 11 illustrates a block view of an exemplary system 1100 including electrical operating state detection device 1000, according to the first embodiment. In some embodiments, electrical operating state detection device 1000 can be configured to detect an electrical operating state of one or more electrical devices 1190 (FIG. 11) in system 1100. Electrical operating state detection device 1000 also can be configured to detect one or more electrical operating states of electrical device 1190 (FIG. 11) in an electrical power line infrastructure 1050 of a structure in system 1100. In many examples, electrical operating state detection device 1000 can sense continuous noise, such as time-varying EMI, placed on electrical power line infrastructure 1050 by electrical devices 1190 to detect the electrical operating states of electrical devices 1190 on electrical power line infrastructure 1050. System 1100 and electrical operating state detection device 1000 are merely exemplary and are not limited to the embodiments presented herein. Electrical operating state detection device 1000 can be employed in many different embodiments or examples not specifically depicted or described herein.

In some examples, when one or more of electrical devices 1190 operate in various electrical states, the one or more of electrical devices 1190 generate time-varying EMI, such that one or more EMI patterns generated by the one of more of electrical devices 1190 changes to a different EMI pattern when the one or more of electrical device 1190 are changed to a different operating state. In many embodiments, the electrical signals can be primarily in the 5 kilohertz to 250 kilohertz range, for example, but also can be at higher or lower frequency ranges, and/or broader or narrower frequency ranges, for different ones of electrical devices 1190.

In some embodiments, each operating state can be a different mode than a particular electronic device (e.g., an appliance) can operate in. For example, a washing machine can operate in a wash, rinse, and spin cycle, and can be categorized as having three operating states. As another example, the washing machine can have additional operating states, such as two different wash cycles, three different rinse cycles, and a spin cycle. The number of operating states can depend upon the granularity with which the states are interpreted, can depend on the intended application, and/or can depend on the appliance's abilities. In many embodiments, operating states can be user selectable and/or can be activated or deactivated as a result of direct user interaction with an appliance. For example, in certain washing machines, sub-rinse cycles can be not considered distinct unless they are user selectable. In many embodiments, operating states can be considered distinct operating states if they can be selectively enabled or disabled by the user. For certain appliances, distinct operating states can exist as a result of a user's direct interaction with the appliance. For example, a user can interact with a computer to change the resulting load of the computer's processor between low, medium, and high. In some embodiments, the number of operating states of an appliance can be discrete. In many embodiments, the number of operating states of an appliance can be equal to or fewer than 20, 15, 12, 10, 9, 8, 7, 6, 5, 4, 3, or 2.

In a number of embodiments, electrical operating state detection device 1000 can include at least one sensing unit 1010 configured to be coupled to at least one electrical outlet 1051 (FIG. 10) of electrical power line infrastructure 1050 (i.e., the electrical power lines in the structure), and/or at least one computational unit 1020. In some embodiment, electrical operating state detection device 1000 does not include electrical power line infrastructure 1050, electrical outlet 1051, or electrical devices 1190. In a different embodiment, electrical operating state detection device 1000 also does not include computational unit 1020. In some examples, electrical detection device 1000 can include processing module 1122 (FIG. 11) but not computational unit 1020.

As shown in FIG. 11, in several embodiments, sensing unit 1010 can include at least one data acquisition receiver 1111, a controller 1115; a communications device 1116, and/or a power source 1117. In a number of embodiments, power source 1117 can be configured to provide electrical power to data acquisition receiver 1111, controller 1115, and/or communications device 1116. In a number of embodiments, communications device 1116 can include a transmitter, such as a wireless or wired transmitter, and can be configured to send information to computational unit 1020. In a number of embodiments, controller 1115 can control data processing and/or data flow within sensing unit 1010, and/or operation of sensing unit 1010.

In many embodiments, computational unit 1020 can include a communications device 1121, a processing module 1122, and a storage module 1130. In several embodiments, communications device 1121 can include a receiver, and can be configured to receive information from sensing unit 1010.

Not to be taken in a limiting sense, a simple example of using electrical operating state detection device 1000 involves electrical devices 1190 generating one or more high-frequency electrical signals (e.g., EMI) on electrical power line infrastructure 1050. Sensing unit 1010 can detect the high-frequency electrical signals (e.g., continuous noise and/or time-varying EMI) on electrical power line infrastructure 1050 and create one or more data signals that include information regarding the high-frequency electrical signals. Sensing unit 1010 can communicate the data signals to computational unit 1020 using a wired and/or wireless communication method. Computational unit 1020 can identify the electrical operating state of electrical devices 1190 at least in part using the data signals.

In many embodiments, data acquisition receiver 1111 can be configured to receive and process one or more electrical signals from electrical power line infrastructure 1050. The electrical signals can include high-frequency components (e.g., EMI). That is, data acquisition receiver 1111 can be configured to receive electrical signals with a high-frequency component and convert the electrical signals and, in particular, the high-frequency component into one or more data signals.

Figure 12:
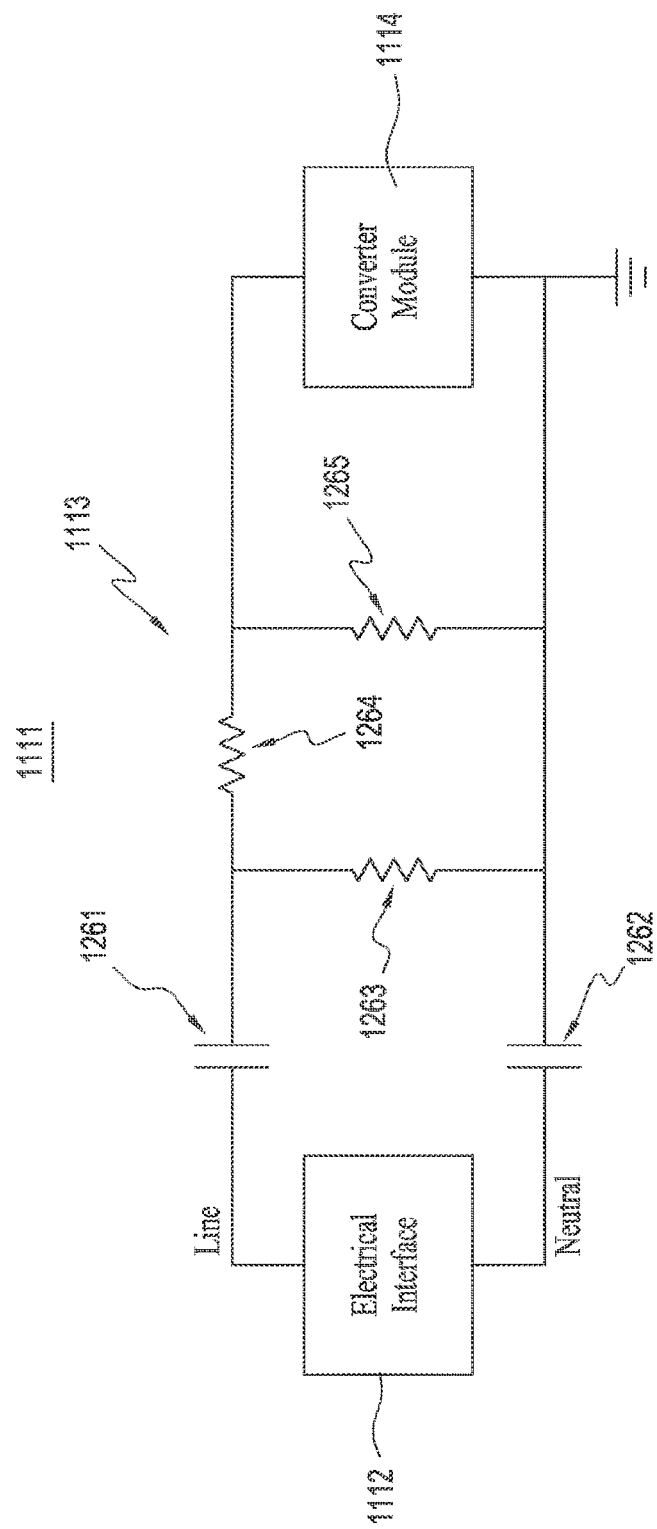
FIG. 12 illustrates a partial circuit diagram of the data acquisition receiver of FIG. 11, according to the first embodiment.

FIG. 12 illustrates a partial circuit diagram of data acquisition receiver 1111, according to the first embodiment. Referring to FIGS. 11 and 12, in various embodiments, data acquisition receiver 1111 can include at least one electrical interface 1112 configured to be coupled to an electrical outlet 1051 (FIG. 10) of electrical power line infrastructure 1050, one or more filter circuits 1113, and at least one converter module 1114. In various embodiments, electrical interface 1112 can include a two-prong or three-prong electrical power connector.

In some embodiments, filter circuits 1113 can be electrically coupled to electrical interface 1112 and configured to filter out portions of the incoming electrical signals from the electrical power infrastructure. For example, filter circuits can be configured to pass the high-frequency electrical noise. In many embodiments, data acquisition receiver 1111 can filter out the AC line frequency (60 Hz in the U.S.) so that converter module 1114 is not overloaded by the strong 60 Hz frequency component. In the same or different examples, filter circuits 1113 can include a high pass filter. In some embodiments, the high pass filter can have an essentially flat frequency response from 5 kHz to 30 MHz (megahertz). The 3 dB (decibel) corner of the high pass filter can be at 5.3 kHz, which can be low enough to capture low RPS motor EMI.

In certain embodiments, filter circuit 1113 can include capacitors 1261 and 1262, and resistors 1263, 1264, and 1265. Capacitors 1261 and 1262 can be 0.1 uF (microfarad) capacitors (450 V (volt) polyester capacitors). Resistor 1263 can be a 300 ohm (Ω), 1 W rated resistor. Resistor 1264 can be a 75Ω, 1 W rated resistor. Resistor 1265 can be a 100Ω, 1 W rated resistor.

In a number of embodiments, converter module 1114 can be electrically coupled to filter circuits 1113 and can be configured to receive the filtered signal from filter circuits 1113. In several embodiments, converter module 1114 can be configured to convert the one or more filtered signals into one or more data signals. The one or more data signals can include information regarding the high-frequency component of the one or more electrical signals. In some examples, converter module 1114 can include an analog-to-digital converter (ADC). In some examples, the ADC can sample the filtered electrical signal at a predetermined rate (e.g., 500 kHz). In one example, converter module 1114 can include a USRP (universal software radio peripheral) N210, which can function as an ADC that samples at 500 kHz.

In some embodiments, communications device 1116 can include a wireless transmitter, and/or communications device 1121 can include a wireless receiver. In some examples, electrical signals can be transmitted using WI-FI (wireless fidelity), the IEEE (Institute of Electrical and Electronics Engineers) 802.11 wireless protocol, or the Bluetooth 3.0+HS (High Speed) wireless protocol. In further examples, these signals can be transmitted via a Zigbee (802.15.4), Z-Wave, or a proprietary wireless standard. In other examples, communications device 116 can transmit electrical signals using a cellular connection or a wired connection (e.g., using a wire). For example, the electrical signals can be transmitted using USB (Uniform Serial Bus), Ethernet, or another wired communication protocol.

As shown in FIG. 11, in various embodiments, processing module 1122 can include software and can include a preprocessing module 1123, an event detection module 1124, a frame extraction module 1125, a feature extraction module 1126, a clustering module 1127, a mapping module 1128, and/or a communications module 1129, as described below in further detail. In many embodiments, computational unit 1020 and/or processing module 1122 can be configured to identify the electrical operating state of electrical devices 1190 at least in part using the one or more first data signals (e.g., information regarding the high-frequency component of the one or more electrical signals).

In a number of embodiments, communications module 1129 can be used to communicate information to and receive information from one or more users of electrical operating state detection device 1000. For example, a user can use communications module 1129 to enter information during a learning sequence. Additionally, communications module 1129 can inform a user when an electrical device (e.g., 1190) is in an operating state. In some embodiments, communications module 1129 can use monitor 1908, keyboard 1904, and/or mouse 1910 of FIG. 19, described below.

In several embodiments, storage module 1130 can store information and data used by processing module 1122. In some examples, storage module 1130 can include a USB device in USB port 1915 (FIG. 19), a CD-ROM or DVD in CD-ROM and/or DVD drive 1916 (FIG. 19), hard drive 1914 (FIG. 19), or memory 2008 (FIG. 20).

Figure 19:
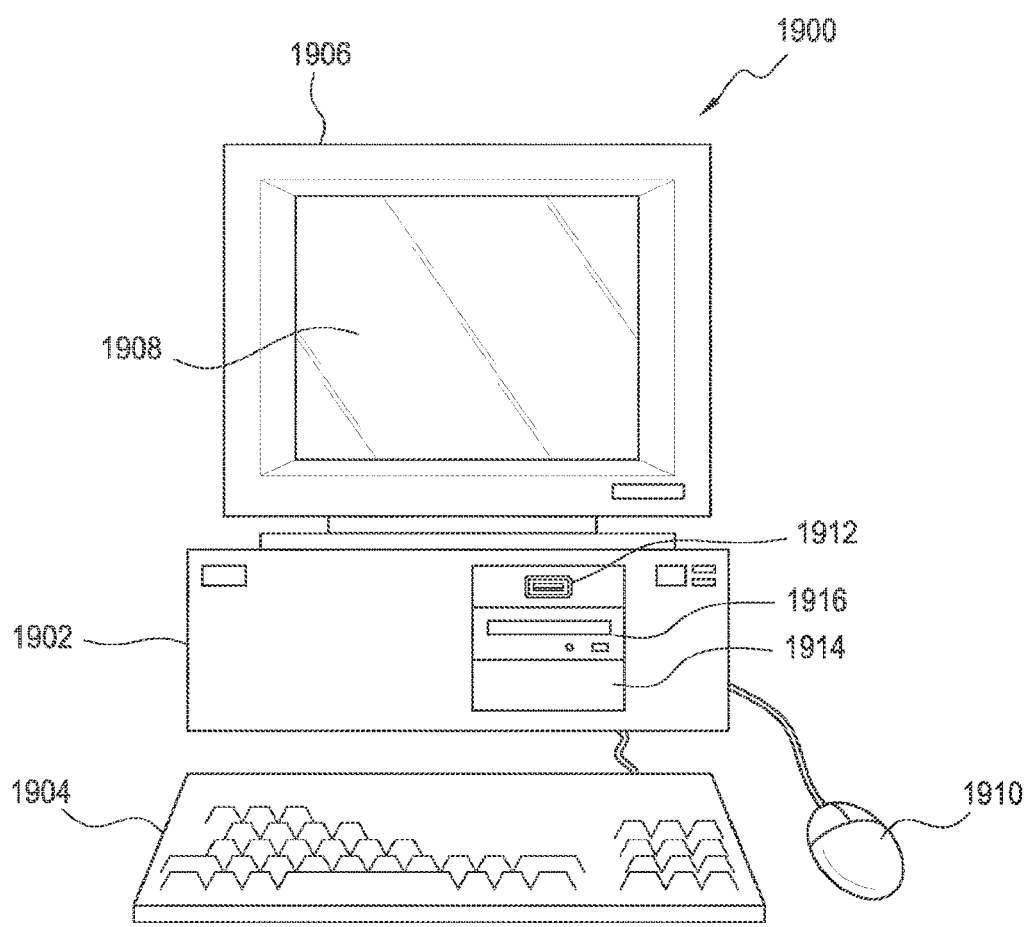
FIG. 19 illustrates a computer system that is suitable for implementing an embodiment of at least a portion of the computational unit of FIGS. 10-11.
Figure 20:
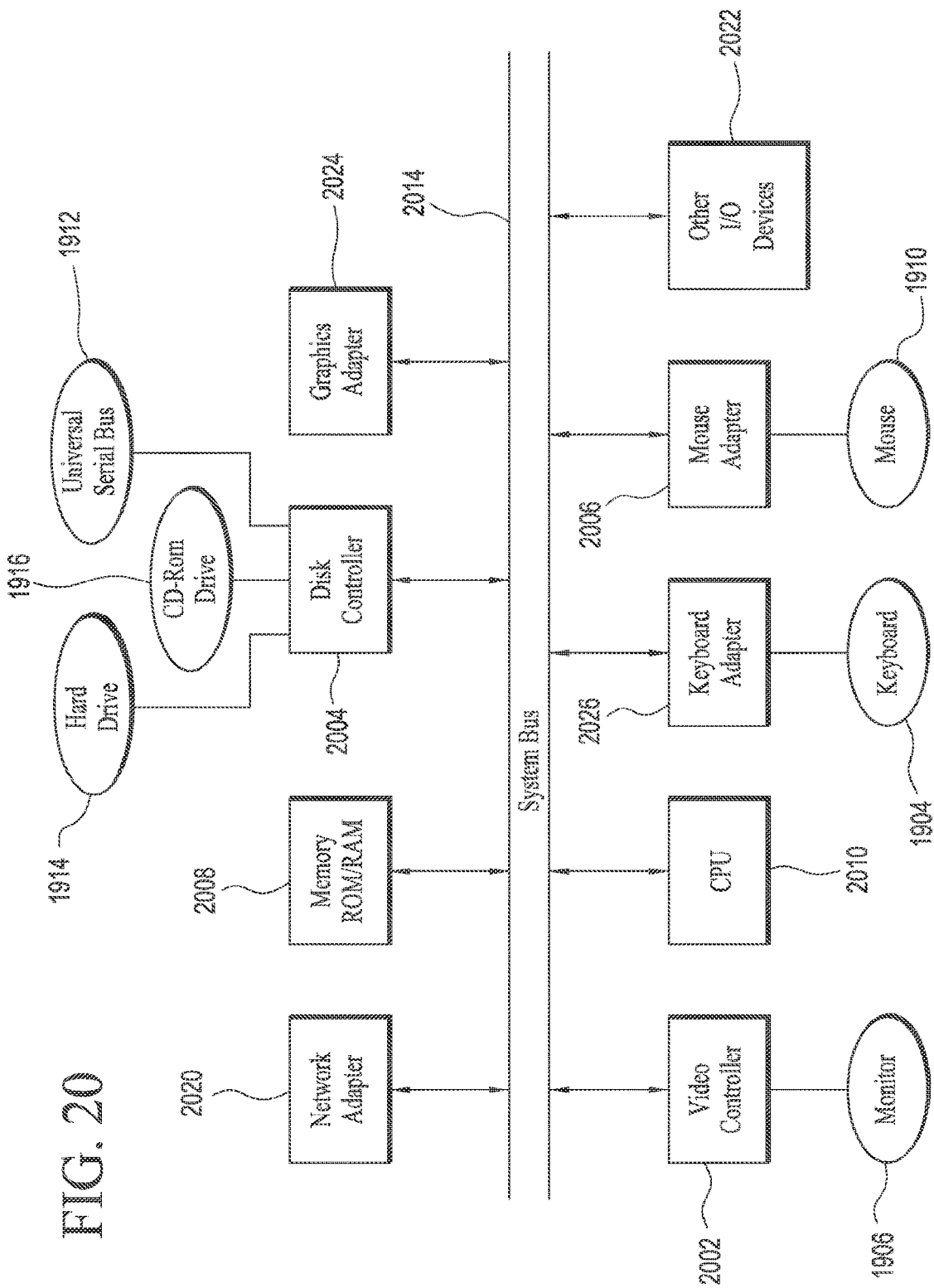
FIG. 20 illustrates a representative block diagram of an example of elements included in circuit boards inside a chassis of the computer system of FIG. 19.

In a number of embodiments, processing module 1122 can be configured to run on a processor (e.g., Central Processing Unit (CPU) 2010 of FIG. 20) of computational unit 1020. "Computational Unit," as used herein, can refer to a single computer, a single server, or a cluster or collection of computers and/or servers at one or more locations. In one example, computational unit 1020 can include the computer illustrated in FIGS. 19 and 20. In some examples, computational unit 1020 can be at least partially local to the user. In other examples, the user can access computational unit 1020 through the Internet or other networks.

In some examples, computational unit 1020 can be a first server. The first server can be a home computer of the user of electrical operating state detection device 1000 or a computer owned or controlled by the owner of the building in which electrical operating state detection device 1000 is installed. In other examples, the first server can be another electrical device (with a processor) located in the structure (e.g., a home control or automation system, a security system, an environmental control system). The first server can include a first portion of communications device 1121, storage module 1130, and/or processing module 1122. One or more second servers (e.g., a computer or server owned or controlled by the manufacturer or distributor of electrical operating state detection device 1000, a utility company, or a security monitoring company) can include a second, possibly overlapping, portion of these modules. In these examples, computational unit 1020 can include the combination of the first server and the one or more second servers.

Data Processing

Figure 13:
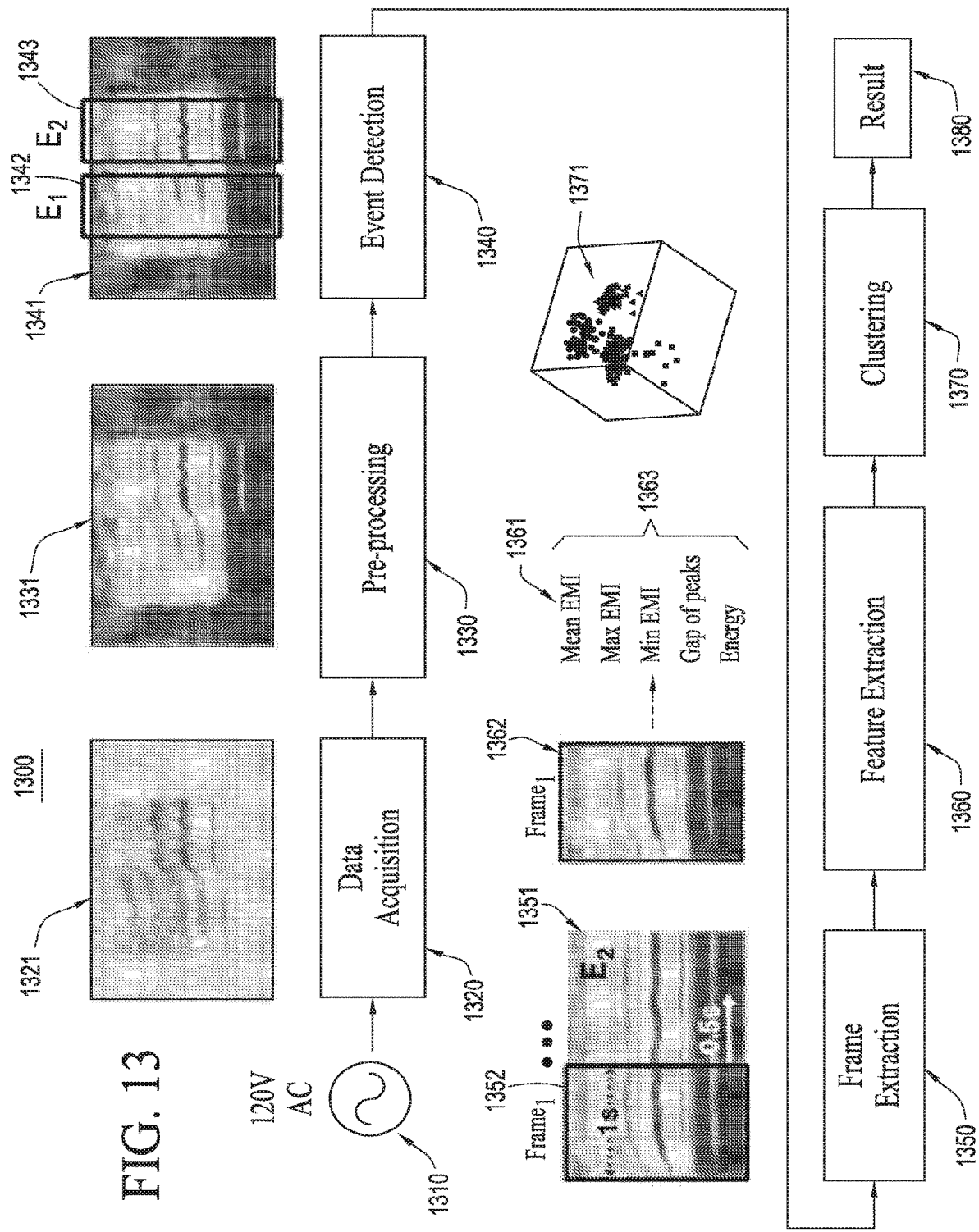
FIG. 13 illustrates a processing pipeline for a process of operating state detection, according to another embodiment.

Turning ahead in the drawings, FIG. 13 illustrates a processing pipeline 1300 for a process of operating state detection, according to another embodiment. Processing pipeline 1300 is merely exemplary and embodiments of the processing pipelines are not limited to the embodiments presented herein. The processing pipeline can be employed in many different embodiments or examples not specifically depicted or described herein. In some embodiments, the procedures, the processes, and/or the activities of processing pipeline 1300 can be performed in the order presented. In other embodiments, the procedures, the processes, and/or the activities of processing pipeline 1300 can be performed in any suitable order. In still other embodiments, one or more of the procedures, the processes, and/or the activities of processing pipeline 1300 can be combined or skipped.

A. Data Acquisition

Referring to FIG. 13, in some embodiments, the flow of processing pipeline 1300 can begin at a block 1320 of data acquisition. In many embodiments, block 1320 of data acquisition can be performed by data acquisition receiver 1111 (FIG. 11). In several embodiments, block 1320 of data acquisition can involve receiving as input an electrical power signal from electrical power infrastructure 1050 (FIGS. 10-11), which can be primarily a 120V AC power signal 1310 that can include high-frequency EMI. In many embodiments, data acquisition receiver 1111 (FIG. 11) can filter out low-frequency signals, such as those below 5.3 kHz, which can strongly reject 60 Hz and its harmonics, avoiding possible damages to the sensing hardware, and which can be low enough to capture low RPS motor EMI. The filtered signal can be fed into a USRP (Universal Software Radio Peripheral) N210, which functions as an ADC sampling at 500 kHz at converter module 1114 (FIG. 11). In other embodiments, the sampling rate can be higher, based on different EMI patterns produced by different types of appliances. Additionally, converter module 1114 (FIG. 11) can compute Fast Fourier Transform (FFT) over these time-domain data, yielding 16384-point FFT vectors with 30.52 Hz bins. This resolution of bin size can allow observing small EMI fluctuations in different operating states. In several embodiments, the FFT vectors can then be streamed from communication device 1116 (FIG. 11) to a processing pipeline in processing module 1122 (FIG. 11) for state detection and classification. FIG. 13 includes an exemplary time-frequency representation 1321 of recorded data output after performing block 1320 of data acquisition.

B. Pre-Processing

In many embodiments, the flow of processing pipeline 1300 can continue at a block 1330 of pre-processing, which can include noise and baseline removal. In several embodiments, block 1330 of pre-processing can be performed by pre-processing module 1123 (FIG. 11). In many embodiments, block 1330 of pre-processing can include removing the baseline signal from recorded data. To remove the baseline signal, the first 100 FFT vectors, for example, in each recorded data file can be averaged to determine the baseline vector. In other embodiments, the number of FFT vectors used for the averaging can be as low as 50 or as high as 350. In a number of embodiments, the number of FFT vectors used for the averaging can be between 100 and 150. This baseline vector can be subtracted subtract it from the remaining FFT vectors. The resulting differential vectors can EMI produced by a later-actuated electronic device. Next filtering can be performed to remove noises resulting from the sensing hardware (e.g., sensing unit 1010 (FIGS. 10-11)) and electrical power infrastructure 1050 (FIGS. 10-11). In particular, a median filter can be applied with a window size of 10 to remove sparse noise. To further smooth the data, TVD (Total Variation Denoising) with a regularization parameter of 20 can be performed. TVD was designed in a different context to remove noise from images with high total variation while preserving important details such as corners and edges. Because EMI signals inherently have excessive, sparse noise, TVD can efficiently remove the noise without damaging most signal characteristics. FIG. 13 includes an exemplary time-frequency representation 1331 of the resultant data after performing block 1330 of pre-processing.

C. Event Detection

Figure 14:
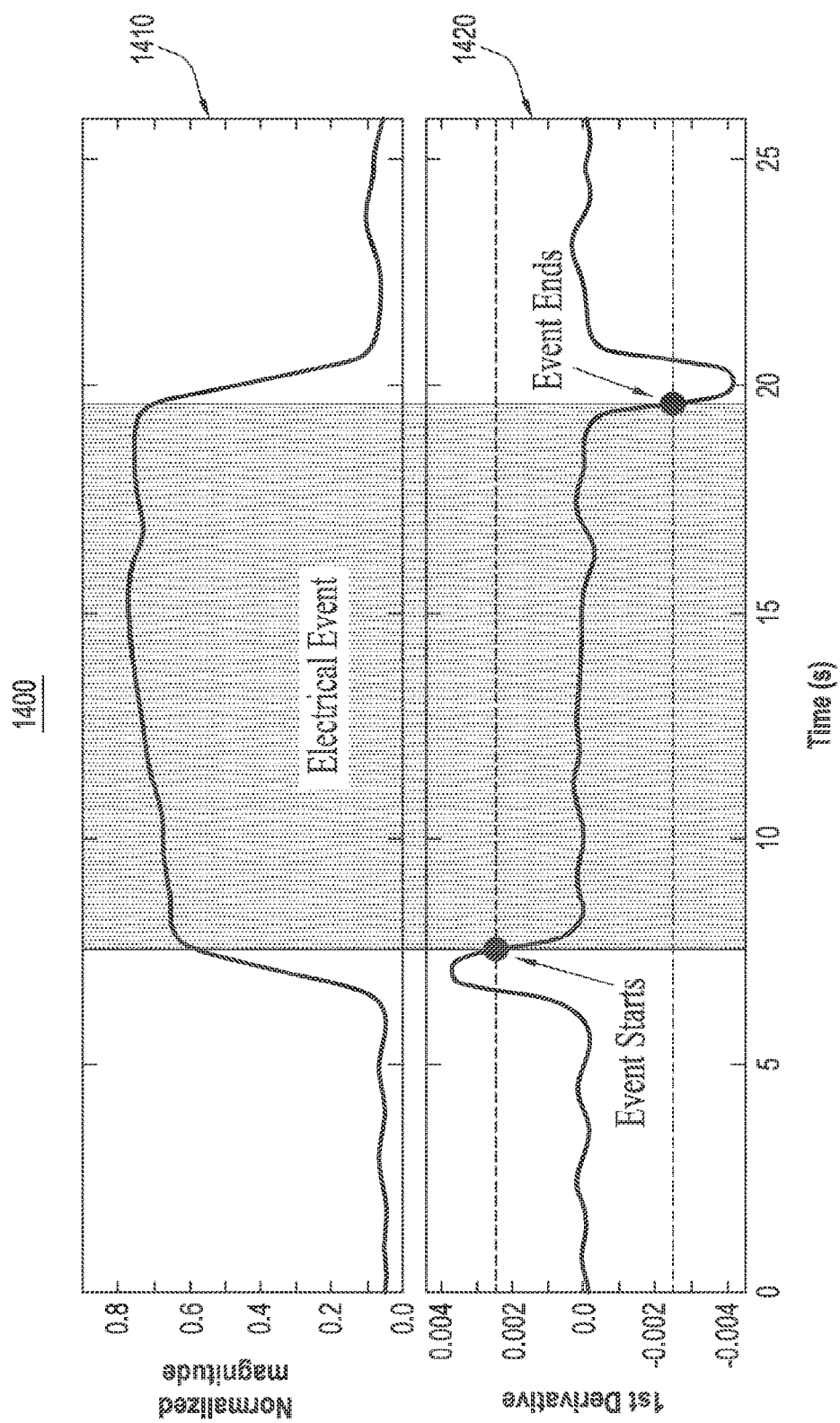
FIG. 14 illustrates graphs for detecting an electrical event, which include an exemplary graph (top) of the normalized magnitude that plots the sum of FFT vectors, and an exemplary graph (bottom) that displays the first derivative of the top graph.

In several embodiments, the flow of processing pipeline 1300 can continue at a block 1340 of event detection. In several embodiments, block 1340 of event detection can be performed by event detection module 1124 (FIG. 11). In many embodiments, block 1340 of event detection can include truncating the recorded data to extract event segments. In several embodiments, the FFT vectors can be summed up. FIG. 14 illustrates graphs 1400 for detecting an electrical event, which include an exemplary graph 1410 of the normalized magnitude that plots the sum of the FFT vectors, and an exemplary graph 1420 that displays the first derivative of graph 1410. The total magnitude fluctuation over time can be plotted, such as shown in graph 1410. Any significant variation in this curve can be indicative of a possible electrical event, which can be segmented using a threshold-based approach. FIG. 14 demonstrates this event detection procedure. Graph 1410 shows the normalized magnitude of the EMI data, where the rising and the falling edge respectively correspond to the start and the end, respectively, of an electrical event. For purposes of this application, an electrical event can be the duration in which an electrical device (e.g., one of electrical devices 1190 (FIG. 11) is in the same operating state. To identify the electrical event, the first derivative of graph 1410 can be determined, as shown in graph 1420. A threshold value can be compared against the first derivative in graph 1420 to determine the start and end of an event. For example, an empirically-derived threshold value of 0.0025 can be used, as shown in graph 1420 (threshold lines shown as dotted lines) to determine the start and end of the electrical event, as shown in graph 1420 at the intersection of the threshold lines and the 1st derivative curve, indicating the event starts at approximately 7 s and ends at approximately 19 s. The threshold value of 0.0025 can be able to robustly detect electrical events while inducing minimal or no false alarms.

After extracting the event segment, block 1340 of event detection can include further truncating the FFT vectors to a specified frequency range that covers all the operating states of an electronic device. This second truncating procedure can advantageously facilitate feature extraction. Because features can be extracted from within the specified spectrum, the truncated FFT vectors can more precisely represent the signal characteristics. To retrieve the target frequency range of a new device, each operating state of the device can be manually turned on and off.

FIG. 13 includes an exemplary time-frequency representation 1341 of the resultant data after performing block 1340 of event detection. As shown in time-frequency representation 1341, block 1340 of event detection can detect a first event 1342 ($E_1$) and a second event 1343 ($E_2$). First event 1342 ($E_1$) can represent a first electronic device in a first operating state, and second event 1343 ($E_2$) can represent the first electronic device a second operating state. For example, the first electronic device can be a blender, and the first operating state can be operating the blender at speed 2, and the second operating state can be operating the blender at speed 4.

D. Frame Extraction

In a number of embodiments, the flow of processing pipeline 1300 can continue at a block 1350 of frame extraction. In several embodiments, block 1350 of frame extraction can be performed by frame extraction module 1125 (FIG. 11). In many embodiments, block 1350 of frame extraction can include further chunking the truncated event segment generated in block 1340 of event detection into smaller units, denoted as frames, by using a sliding window of 1 s with 0.5 s overlapping between each subsequent frame. FIG. 13 includes an exemplary time-frequency representation 1351 of second event 1343 ($E_2$) detected after performing block 1350 of frame extraction, showing a 1-second frame 1352 ($Frame_1$) that is extracted from second event 1343 ($E_2$). EMI shows stable signal characteristics within the same operating state. The short-term analysis provided by a 1-second frame serves to confirm the stability of EMI characteristics within the same operating state, and allows analysis of variations if the EMI fluctuates dramatically in the same operating state.

E. Feature Extraction

In various embodiments, the flow of processing pipeline 1300 can continue at a block 1360 of feature extraction. In several embodiments, block 1360 of feature extraction can be performed by feature extraction module 1126 (FIG. 11). In many embodiments, block 1360 of feature extraction can include extracting aggregated features from each frame extracted in block 1350 of frame extraction, based on signatures of different time-varying EMI. In a number of embodiments, the first six features can include the mean magnitude, maximum magnitude, minimum magnitude, mean frequency, maximum frequency, and minimum frequency of the peak EMI of the frame. These features can describe the characteristics of the fundamental EMI. For motor-based devices, there usually exist multiple peak EMIs due to uneven rotations caused by the fractions and electric resistance. To capture this, a seventh feature can include the frequency gap between the two dominant EMI peaks. Some EMI has distinct total magnitude variation, such as a laptop under different CPU loads or hair dryer under different temperature modes. To capture this, an eighth feature can include the mean magnitude (energy) of the frame. In many embodiments, block 1360 of feature extraction can extract an 8-tuple feature vector for each frame. Other embodiments can include some of these eight features and/or additional features. FIG. 13 includes an illustration 1361 of extracting features 1363 from time-frequency representation 1362, which can be identical to frame 1352 ($Frame_1$) extracted after performing block 1350 of frame extraction.

F. Clustering

In various embodiments, the flow of processing pipeline 1300 can continue at a block 1370 of clustering. In several embodiments, block 1370 of clustering can be performed by clustering module 1127 (FIG. 11). In many embodiments, block 1370 of clustering can include classification of operating states. In many embodiments, an expectation maximization (EM) clustering algorithm can be used, which can advantageously allow for adaption to uneven cluster sizes. A resident of a structure may use each electrical device in different operating states unevenly in daily life, thus there may be significant variation in cluster sizes corresponding to different operating states. Beneficially, EM typically outperforms other similar algorithms such as k-means clustering, which is more sensitive to the cluster size. EM advantageously allows clusters to overlap. If an appliance has two similar operating states, such as similar rotation speed in 2 modes of a food mixer, the respective clusters generally will overlap in the feature space.

Further, EM requires the number of clusters as the only input parameter. The number of operating states of an appliance generally can be perceived from a user perspective from its outlook, such as six button on a blender; its modes of physical use, such as vacuuming on different surfaces; or its circuitry model. When a new device is used, this human observation can be employed as a prior knowledge to train the model, which can advantageously obviate the need to label each individual state during calibration. This domain knowledge can be leveraged to determine the input parameter, that is, the number of clusters, to the EM classifier.

The output of block 1370 of clustering is shown in FIG. 13 as result 1380. In many embodiments, EM can be semi-supervised learning, so the output can be unlabeled clusters, each of which represents an unknown operating state. FIG. 13 includes an exemplary clustering 1371 of three clusters (shown as circles, triangles, and squares in clustering 1371). In some embodiments, block 1370 of clustering can include mapping the unlabeled clusters to operating states, which can be performed by mapping module 1128 (FIG. 11). In some embodiments, mapping the unlabeled clustered to operating states can be based at least in part on one or more feature vectors. For example, if one or more feature vectors indicate that a first cluster overall has a higher frequency than a second cluster, the first cluster can be a higher operating speed of the appliance than the second cluster. In some embodiments, labelling can be performed in the data collection process, and the operating state of a cluster can be determined based on the percentage of the classifiers within the cluster having a given label, as described below in greater detail. In some embodiments, mapping can include using additional types of data to identify the operating state, such as data from a database of a regulatory agency; data from one or more databases that contain data regarding previously observed data signals; data from one or more labels of the electrical devices; and/or data from the user regarding identification of the one or more electrical devices and/or their operating states. In some embodiments, EM clustering can be performed on individual appliances to train their models separately. In some embodiments, of EM clustering can be implemented using the Scikit-learn package, a machine learning library for Python. In other embodiments, other implementations can be used.

Evaluation and Analysis

A. Evaluation Design

To evaluate the techniques described herein, an evaluation was conducted in a real home environment. This residential house is a triplex, 1100 square foot townhouse of two residents (one male, one female). To explore the temporal stability of the signal, the data collection process was conducted across two months, including multiple sessions at different times (morning, afternoon, and night) on both weekdays and weekends. During each session, one resident was asked to turn on a device to a specified operating state for a random time (5 s-10 s) and then turned it off. When one resident was executing the requested action, the other resident remained performing his or her daily routines such as cooking, using a computer, or watching TV. Each electrical event was manually labeled. It is noted that these labels were used only for evaluation, not for model training. Throughout the evaluation, 580 electrical events were collected in total.

To collect the data, the sensing hardware (specifically, a power line interface and USRP N210), and a laptop in the participant's house was used. The laptop is a local server for recording EMI data and the follow-up processing pipeline. For each type of time-varying EMI, four to six different appliances were chosen. In total, sixteen electronic devices were evaluated in the evaluation. Table I below shows the list of these devices. Based on the previously demonstrated stability of EMI signals across different homes, the findings in this evaluation can be applied to other households.

B. Defining Different Operating States

Different appliances of the same type usually have minor differences in operating states. For example, one blender can have 6 speed modes while another blender can have 7 speed modes. In this evaluation, the same number of states for devices within the same categories was used in order to get a baseline to compare between them, as shown in the "Operating States" fields of Table I below.

1. Operating States of Motor-Based Devices

For vacuum cleaners, two states were defined based on the surface where it is used (i.e., on a rug or hardwood floor). Most vacuum cleaners have a hose, which can be detached from the machine and used separately. "Using the hose" was defined here as a third state. One of the vacuum cleaners (specifically, the Eureka 1432A) does not equip a hose so it was evaluated only on the two defined surfaces. For other motor-based appliances, such as blenders and food mixers, the states are defined by their operating speeds.

2. Operating States of SMPS-Based Devices

For laptops, three different states were defined based on CPU loads. In the idle mode, all applications were turned off and the CPU load was kept below 10% usage. In the medium load, a testing script was run that periodically calculates a specified math equation and meanwhile opens a couple webpage and YouTube videos, maintaining CPU loads floating between 30% and 60%. To simulate a high load, an online benchmark was run, called SilverBench1, which forced CPU usage above 90%. For TV, an operating states is defined as the action of switching a channel.

3. Operating States of Mixed-Mode Devices

States of a hair dryer were defined by the operating temperatures of cold, warm, and hot. Some modern hair dryers have various temperatures modes combined with different fan speeds. As the factor of speed has been evaluated in motor-based appliances (e.g., vacuum cleaner, blender and food mixer), in this category, the focus of the evaluation was on temperature variation, that is, how a large resistive load affects the time-varying EMI.

C. System Performance and Analysis

As explained above, the output of block 1370 of clustering are unlabeled clusters, each of which represents an unknown operating state. For analysis purposes, each predicted cluster (i.e., as predicted by the EM clustering) was assigned to its actual class (i.e., its actual operating state) based on majority vote using labels that were annotated in the data collection process. Clusters with the same voting results were merged. Table I below shows the classification results of individual appliances.

TABLE 1

| EMI Type | Device | Make/Model | Operating States | Actual Clusters | Predicted Clusters | Accuracy |
|---|---|---|---|---|---|---|
| Motor-based | Vacuum Cleaner | Bissel 6584 | Rug/ | 3 | 3 | 100% |
| | | Hoover Elite II | Hardwood/Hose | 3 | 3 | 100% |
| | | Eureka 1432A | Rug/Hardwood | 2 | 2 | 98.5% |
| | Blender/ Food Mixer | Hamilton Beach 62560 | 6 Rotation Speed | 6 | 5 | 87.4% |
| | | Cuisinart PowerBlend 600 | | 6 | 6 | 89.9% |
| | | Oster Listed 654A | | 6 | 6 | 84.0% |
| SMPS-based | Laptop/ Computer | Acer Aspire 15" | Idle/ | 3 | 3 | 99.7% |
| | | Dell Inspiron 15" | Medium/ | 3 | 3 | 98.8% |
| | | Toshiba Portege 13" | High Load | 3 | 3 | 92.1% |
| | | PC (300 W) | | 3 | 3 | 100% |

TABLE 1-continued

| EMI Type | Device | Make/Model | Operating States | Actual Clusters | Predicted Clusters | Accuracy |
|---|---|---|---|---|---|---|
| | Television | Visio 32" | Channel switching (hit rate) | * | * | 100% |
| | | Sharp 42" | | * | * | 90% |
| Mixed | Hair Dryer | Remington Speed2Dry | Cold/ Warm/ Hot | 3 | 3 | 81.5% |
| | | Tashin Powerslit TS-318A | | 3 | 3 | 81.8% |
| | | Tashin TS-3000 | | 3 | 3 | 96.7% |
| | | Gibson GSN-760 | | 3 | 3 | 100% |

Overall, the evaluation resulted in an average accuracy of 93.8% across 16 appliances. All vacuum cleaners reported high classification accuracy. The 3rd state of using the hose was founds to be a highly discernible cluster in the trained EM model. In the evaluation, the participant was asked to use the hose to clean the corner of a wall. Compared to the machine used on a rug, the hose moves unevenly above the surface and causes an irregular EMI fluctuation. In addition, the detachment of a hose affects the airflows through the container due to changes in air pressure. These two factors cause time-varying EMI distinct from the other two modes of use on the rug and the hardwood floor, thus yielding high classification accuracy.

Similarly, almost all laptops/PC and TVs report high accuracy. The Toshiba Portege 13" laptop reported a slightly lower accuracy of 92.1%. This model produces weaker EMI than other computers, so it induces less discernible EMI between different CPU loads. Specifically, the confusion occurred between the "idle" mode and the "medium load" mode, with a recall of 81.7%. The EMI of the Sharp 42" TV is sensitive to the contents being displayed and produced some dramatically fluctuating EMI. In such circumstances, the EMI generated by channel switching becomes unrecognizable and thereby slightly downgrades the event detection rate to a hit rate of 90%. To further explore the system robustness, 40 minutes of EMI data was recorded from both TVs without any actions of channel switching. Only two false alarms were detected, showing the robustness of the algorithm against this fluctuation.

Blenders and food mixers show a relatively low accuracy of 84%-89.9%. The Hamilton food mixer had confusions between speed mode 2 and 3, which were merged into the same class with low accuracy, with a recall of 54.7%. Similarly, the Cuisinart blender had confusions between speed mode 3 and 4, with a recall of 64.4%) while the Oster blender had confusions between speed mode 1 (recall of 76.5%), 2 (recall of 65.9%) and 3. These confusions resulted from similar characteristics between operating states. Examination of the data revealed that frequency and magnitude of the confused states were quite similar After filtering in block 1330 (FIG. 13) of pre-processing, these minor differences between states were smoothed out and became hard to differentiate, implying that fundamentally the device does not have as many discernible operating speeds as it claims.

Finally, there were high variations in accuracy of hair dryers, of 81.5%-100%. For two hair dryers with relatively low accuracy (81.5% and 81.8%), the confusion occurred between the "cold" and "warm" mode. Similar EMI patterns were observed in these two modes, which can be used to infer that, in the warm mode, the parallel resistive load is small in these devices. That is, it does not cause discernible changes in the total current loads compared to that in cold mode, yielding similar EMI patterns. As described earlier, the difference in circuit design between hair dryers is attributed to different manufacturers.

Discussion

A. Energy Disaggregation

Figure 15:
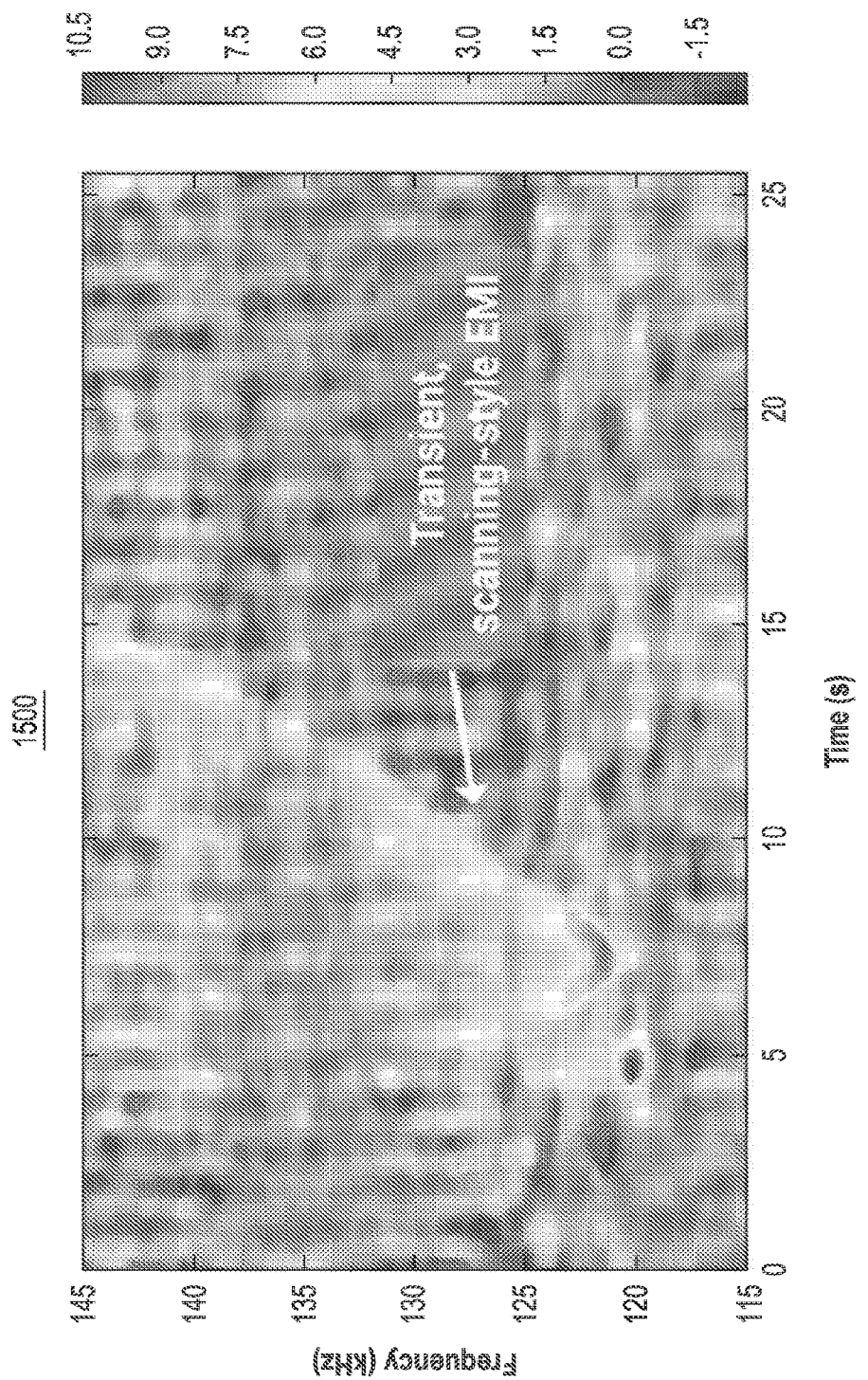
FIG. 15 illustrates a time-frequency representation of the transient, scanning-style EMI for the a TV, displaying the transient EMI between 115 kHz and 145 kHz.

As described herein, there are distinct signal characteristics when a device operates at different operating states. For the same type of devices, there also exist minor differences in their EMI patterns. For example in the Oster Listed 564A blender, a strong EMI is observed between its fundamental and 1st harmonic, but similar patterns were not observed in other blenders or food mixers. The Gibson GSN-760 hair dryer, instead of producing a continuous EMI, produces a switching-style EMI when operating at cold mode. Similarly, in the Vizio 32" TV, when switching to a new channel, the TV produces a transient, scanning-style EMI between 115 kHz and 145 kHz. FIG. 15 illustrates a time-frequency representation 1500 of the transient, scanning-style EMI for the Vizio 32" TV, displaying the transient EMI between 115 kHz and 145 kHz. This transient signal in the spectrum is away from its fundamental frequency and was not found on the other TVs. In some embodiments, these small but significant differences between devices can provide granular information for manufacturer identification and energy disaggregation. For devices of the same type, their generated EMI patterns usually overlap at similar frequency ranges (e.g., motor-based devices below 20 kHz). These nuances in time-varying EMI can be employed to differentiate these devices.

B. Activity Recognition

In a number of embodiments, understanding fine-grained electricity data can be beneficial to activity-inference determination. For example, different behaviors of using a hair dryer (e.g., cold vs. hot) can imply different residents within a household. The duration of using the vacuum cleaner in different areas (e.g., rug vs. hardwood floor) can be used to infer active areas in home. In addition, the fluctuating EMI of a blender can be attributed to what food is being processed. For example, the action of "ice crush" shows time-varying EMI during the process. Additionally, the action of switching a TV channel can be strongly indicative of a "watching TV" activity. This interaction between a resident and a TV can be difficult to capture through a motion sensor, as a sensor event does not necessarily directly relate to the actual activity. Instead, it can be activated by other possible activities such as "reading," "using a computer," or a pet passing through. Detecting operating states thus can advantageously support whole-home activity recognition.

C. Combining Other Sensing Approaches

Figure 16:
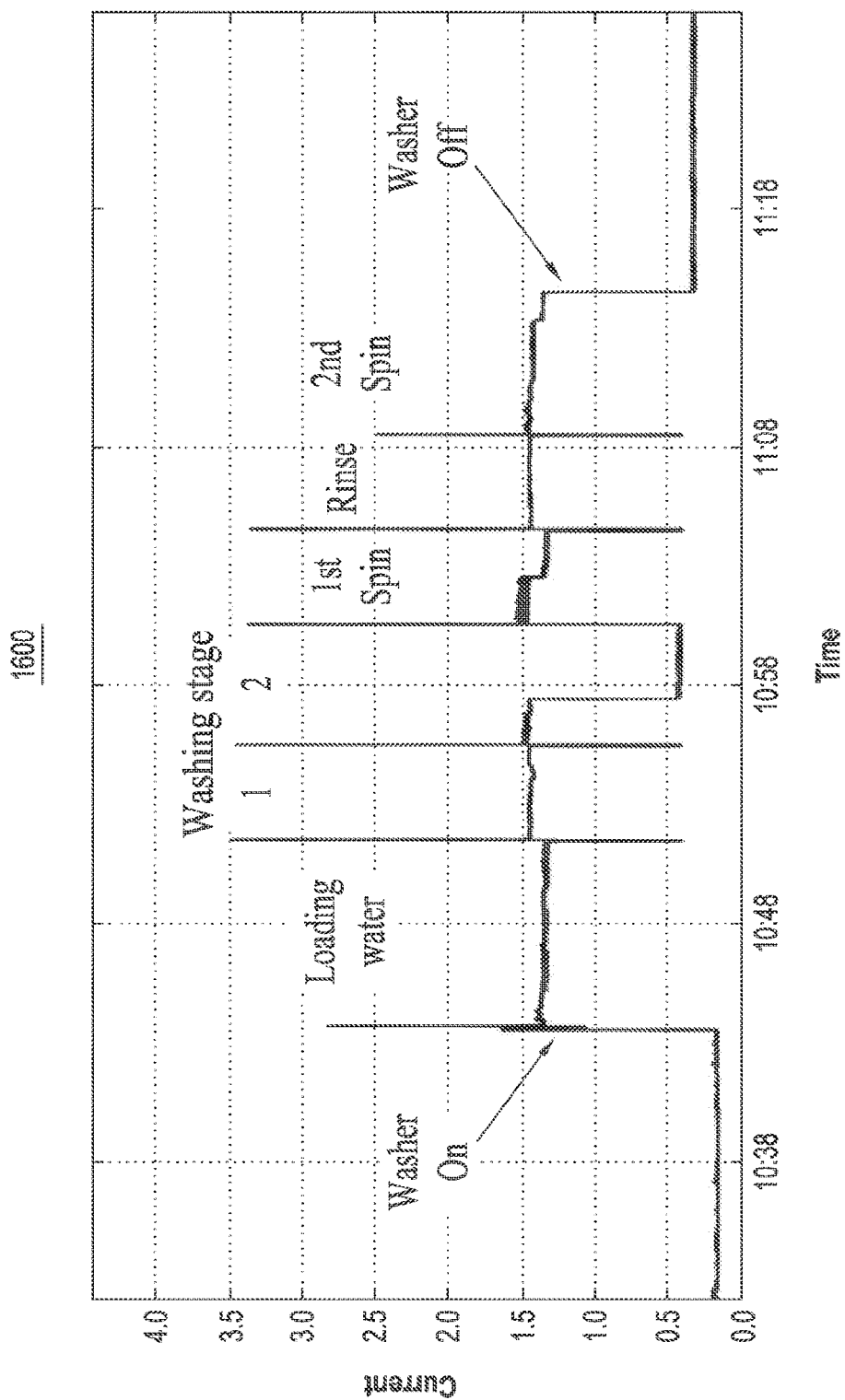
FIG. 16 illustrates a graph of current loads of a stacked washer in a complete high-load washing cycle.
Figure 17:
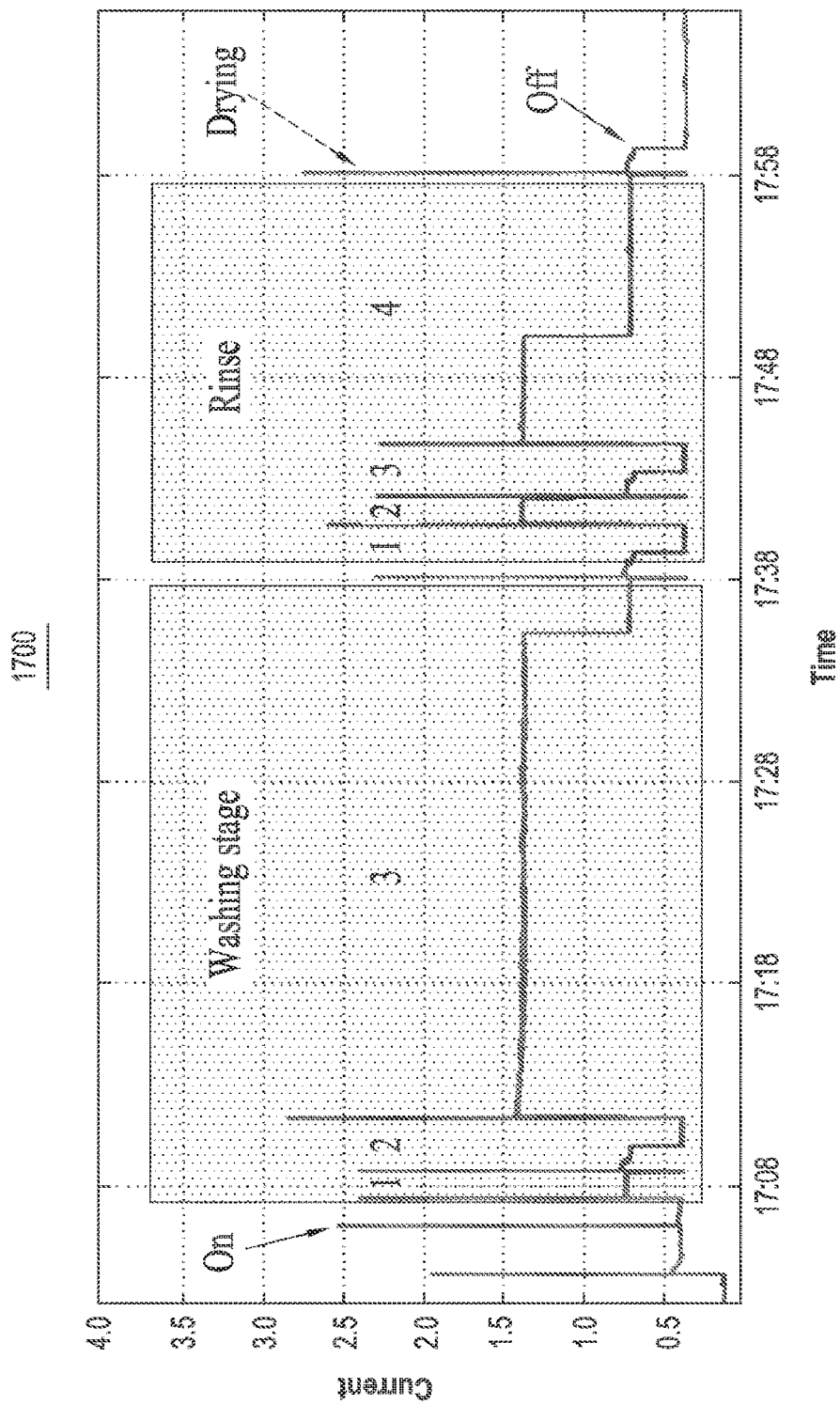
FIG. 17 illustrates a graph of current loads of a dishwasher in a complete washing cycle.

Some home appliances, such as an old washer or fridge, do not produce observable EMI signals. In some embodiments, the on- and off-states of these devices can be extracted from their current or consumption data. A current detection device can be used to determine current usage of an appliance. FIG. 16 illustrates a graph 1600 of current loads of a stacked washer in a complete high-load washing cycle. Specifically, the stacked washer used is the General Electric, WSM-2420. The current draws show discernible signal patterns in different operating states. Similar varying current draws can also be observed on a dishwasher. For example, FIG. 17 illustrates a graph 1700 of current loads of a dishwasher in a complete washing cycle. Specifically, the dishwasher used is the Whirlpool DU810SWP. Leveraging both time-vary EMI and disaggregated current/power data can further support whole-home activity sensing. As described earlier, disaggregating current or power usage from the total consumption can rely on step changes in its signal. In many embodiments, further signal processing and machine learning technology can be used to detect these step changes that are attributed to different operating states.

D. Detecting Machine Failure

In some embodiments, the systems and methods described herein can be used for machine failure detection by observing changes in known states or the presence of a new, abnormal operating state. For example, a blender may show abnormal EMI caused by malfunction in its motor (e.g., observing EMI at a lower frequency when running at a relatively higher speed). As another example, a computer with high magnitude EMI in its idle mode may be attributable to flawed hardware (e.g., a faulty video card). As yet another example, a vacuum with a decreased frequency EMI can correspond to a plugged vent filter or even motor failure.

E. Advantages

In many embodiments, the systems and methods described herein can be used to detect operating states of electronic appliances. In several embodiments, the systems and methods described herein can utilize time-varying EMI signals produced by electronic appliances when they are operating at different operating states. In several embodiments, this EMI is coupled onto the power lines and can be captured using a single sensing hardware installed from anywhere in the house. The systems and methods described herein can use semi-supervised learning for state estimation, which can exploit domain knowledge of the devices to train the classifier and can avoid the need for manually labeled data. In various embodiments, the systems and methods described herein can provide robust state estimation in a real home setting. The systems and methods described herein can afford a low-cost, single-point sensing approach to discover fine-grained features of electrical events for supporting applications such as energy disaggregation, machine failure detection, or activity inference, such as in a smart home environment.

In several embodiments, the systems and methods described herein can provide a novel, low-cost technique for sensing operating states of electronic devices using time-varying EMI from a single sensing point. In various embodiments, the systems and methods described herein can provide an algorithm that can leverage domain knowledge and can use semi-supervised learning techniques to obviate the need of labeled data, which can significantly reduce the training effort. In some embodiments, the systems and method described herein can detect fine-grained electrical characteristics, which can afford rich feature sets of electrical events and can support various applications, such as in-home activity inference, energy disaggregation, and device failure detection.

Figure 18:
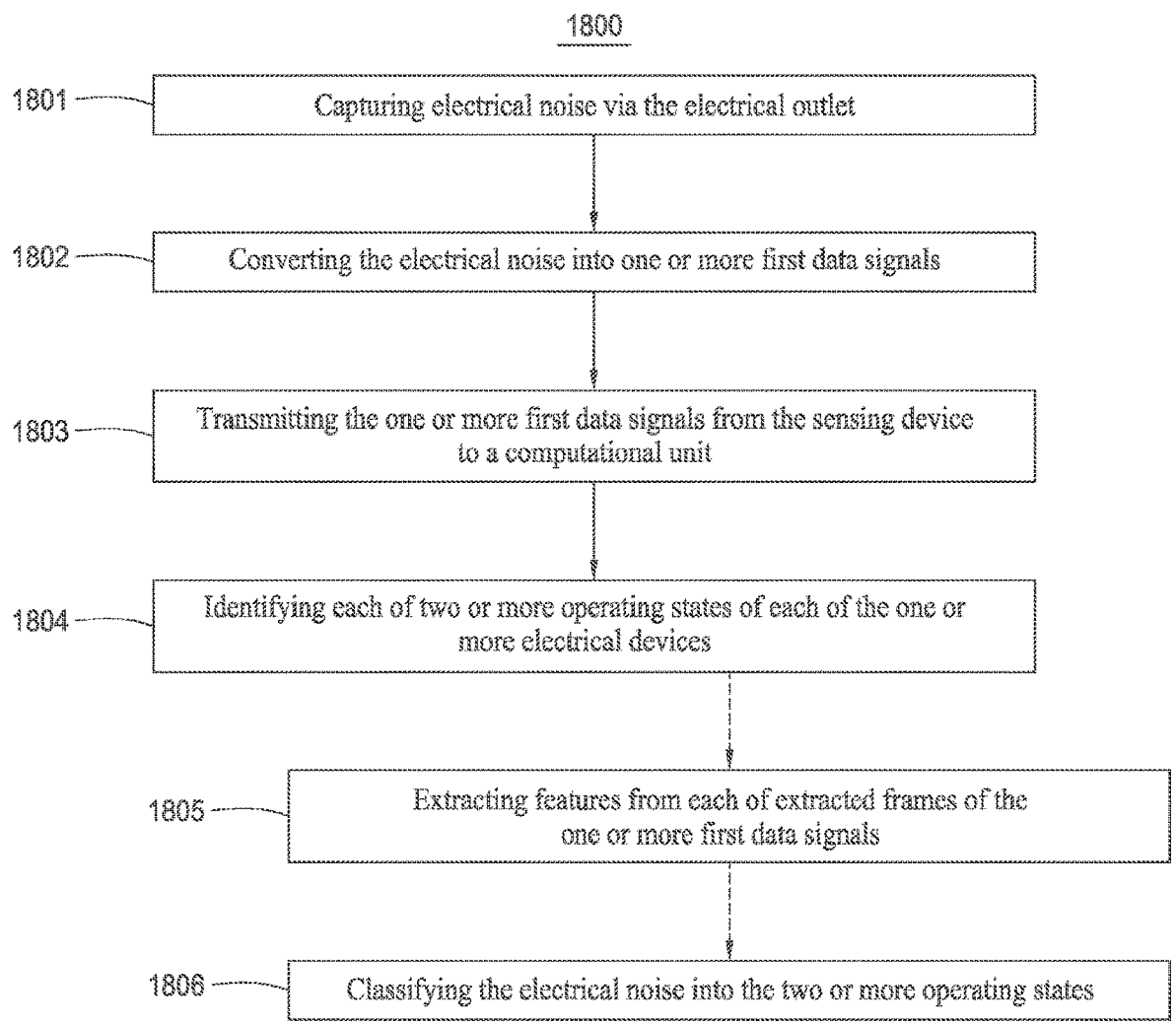
FIG. 18 illustrates a flow chart for a method, according to another embodiment.

Turning ahead in the drawings, FIG. 18 illustrates a flow chart for a method 1800, according to an embodiment. In some embodiments, method 1800 can be a method of detecting operating states of electrical devices. Method 1800 is merely exemplary and is not limited to the embodiments presented herein. Method 1800 can be employed in many different embodiments or examples not specifically depicted or described herein. In some embodiments, the procedures, the processes, and/or the activities of method 1800 can be performed in the order presented. In other embodiments, the procedures, the processes, and/or the activities of method 1800 can be performed in any suitable order. In still other embodiments, one or more of the procedures, the processes, and/or the activities of method 1800 can be combined or skipped.

Referring to FIG. 18, in some embodiments, method 1800 can include a block 1801 of capturing, at a sensing device coupled to an electrical outlet, electrical noise via the electrical outlet. The sensing device can be similar or identical to sensing device 1010 (FIGS. 10-11). The electrical outlet can be similar or identical to electrical output 1051 (FIG. 10). In several embodiments, the electrical outlet can be coupled to an electrical power infrastructure. The electrical power infrastructure can be similar or identical to electrical power line infrastructure 1050 (FIGS. 10-11). In some embodiments, one or more electrical devices can be coupled to the electrical power infrastructure and can generate at least a portion of the electrical noise on the electrical power infrastructure. The electrical devices can be similar or identical to electrical devices 1190 (FIG. 11).

In a number of embodiments, method 1800 also can include a block 1802 of converting, at the sensing device, the electrical noise into one or more first data signals. In some embodiments, the first data signals can be similar or identical to the FFT vectors computed by converter module 1114 (FIG. 11), described above. In other embodiments, the first data signals can be another suitable representation of the electrical noise. For example, in some embodiments, converting the electrical noise into the first data signals can be similar or identical to at least a portion of block 1320 (FIG. 13) of data acquisition, as described above. In many embodiments, data acquisition receive 1111 (FIG. 11) can at least partially perform block 1802 of converting the electrical noise into one or more first data signals, as described above.

In some embodiments, the sensing device can include a data acquisition receiver comprising a filter configured to pass the electrical noise that is above approximately 5.3 kilohertz. The data acquisition receiver can be similar or identical to data acquisition receiver 1111 (FIG. 11).

In a number of embodiments, method 1800 additionally can include a block 1803 of transmitting the one or more first data signals from the sensing device to a computational unit. The computational unit can be similar or identical to computational unit 1020 (FIGS. 10-11). In some embodiments, the first data signals can be transmitted, such as through communications device 1116 (FIG. 11) of sensing device 1010 (FIGS. 10-11) to communications device 1121 (FIG. 11) of computational unit 1020 (FIGS. 10-11).

In several embodiments, method 1800 further can include a block 1804 of identifying, at a processing module of the computational unit, each of two or more operating states of each of the one or more electrical devices at least in part using the one or more first data signals. The processing module can be similar or identical to processing module 1112 (FIG. 11). In many embodiments, the two or more operating states of the electrical devices can be detected using various modules of processing module 1112 (FIG. 11), such as pre-processing module 1123, event detection module 1124, frame extraction module 1125, feature extraction module 1126, clustering module 1127, mapping module 1128, and/or communications module 1129. In various embodiments, the two or more operating states of each electrical device of the one or more electrical devices can each be different user-driven operating states of the electrical device when the electrical device is in an on-power state. In some embodiments, block 1804 can include identifying an operating state of each electrical device of the one or more electrical devices from among at least two or more operating states of the electrical device.

In many embodiments, the electrical noise can include first identifiable electrical noise on the electrical power infrastructure during a first time period corresponding to a first operating state of the two or more operating states; and second identifiable electrical noise on the electrical power infrastructure during a second time period corresponding to a second operating state of the two or more operating states. For example, the first identifiable electrical noise during the first time period can correspond to a first operating state, such as a first speed of a blender, and the second identifiable electrical noise during the second time period can correspond to a second operating state, such as a second speed of the blender at a different time. In some embodiments, identifying each of the two or more operating states can include distinguishing the first identifiable electrical noise from the second identifiable electrical noise to identify the two or more operating states of each of the one or more electrical devices. In many embodiments, the first time period is at least 1 second and/or the second time period is at least 1 second.

In several embodiments, the first identifiable electrical noise and the second identifiable electrical noise each can include substantially continuous electrical noise on the electrical power infrastructure. In various embodiments, the substantially continuous electrical noise can include (a) first electrical noise that is identifiable on the electrical power infrastructure for a first length of time that is greater than one alternating current electrical cycle, or (b) second electrical noise that is identifiable on the electrical power infrastructure for a second length of time that is less than one alternating current electrical cycle but the second electrical noise is repeated in three one or more alternating current electrical cycles.

In many embodiments, the one or more electrical devices can include one or more motor-based appliances each configured to be manually switched to two or more different rotational speeds. In a number of embodiments, each of the two or more operating states of the one or more motor-based appliances correspond to a different one of the two or more different rotational speeds. In several embodiments, the one or more motor-based appliances can include at least one of a blender or a food mixer.

In some embodiments, the one or more electrical devices can include a motor-based vacuum. In several embodiments, a first operating state of the two or more operating states can correspond to idling the motor-based vacuum on a rug. In a number of embodiments, a second operating state of the two or more operating states can correspond to moving the motor-based vacuum on the rug. In various embodiments, a third operating state of the two or more operating states can correspond to using the motor-based vacuum on a hard floor.

In several embodiments, the one or more electrical devices can include one or more SMPS-based appliances each including an oscillator and each configured to operate at two or more different switching frequencies. In some embodiments, each of the two or more operating states can correspond to a different one of the two or more different switching frequencies.

In various embodiments, the one or more SMPS-based appliances can include a computer comprising a central processing unit. In a number of embodiments, each of the two or more different switching frequencies can correspond to a different load of the central processing unit.

In some embodiments, the one or more SMPS-based appliances can include a television. In many embodiments, a first frequency of the two or more different switching frequencies can correspond to displaying a television channel on the television. In various embodiments, a second frequency of the two or more different switching frequencies can correspond to a transient channel change operation of the television.

In a number of embodiments, the one or more electrical devices can include one or more appliances each including two or more different switched resistive loads. In many embodiments, each of the two or more operating states can correspond to a different one of the two or more different switched resistive loads. In some embodiments, the one or more appliances can include at least one of a hair dryer or a fan heater.

In a number of embodiments, block 1804 of identifying each of two or more operating states of each of the one or more electrical devices at least in part using the one or more first data signals can include a block 1805 of extracting features, at the processing module, from each of extracted frames of the one or more first data signals. In many embodiments, the extracted frames can be similar of identical to frame 1352 (Frame$_1$) in FIG. 13. In a number of embodiments, the extracted frames can be extracted using frame extraction module 1125 (FIG. 11), such as described in block 1350 (FIG. 13) of frame extraction. In various embodiments, the features can be similar or identical to features 1363 (FIG. 13). In some embodiments, the features can be extracted using feature extraction module 1126 (FIG. 11), such as described in block 1360 (FIG. 13) of feature extraction. In some embodiments, the features can include at least one of a mean magnitude, a maximum magnitude, or a minimum magnitude of a peak electromagnetic interference of each of the extracted frames; at least one of a mean frequency, a maximum frequency, or a minimum frequency of the peak electromagnetic interference of each of the extracted frames; and at least one of a frequency gap between two dominant electromagnetic interference peaks of each of the extracted frames or an overall mean magnitude of each of the extracted frames. In various embodiments, the features can include the mean magnitude, the maximum magnitude, and the minimum magnitude of the peak electromagnetic interference of each of the extracted frames; the mean frequency, the maximum frequency, and the minimum frequency of the peak electromagnetic interference of each of the extracted frames; the frequency gap between the two dominant electromagnetic interference peaks of each of the extracted frames; and the overall mean magnitude of each of the extracted frames.

In several embodiments, block 1804 of identifying each of two or more operating states of each of the one or more electrical devices at least in part using the one or more first data signals can include a block 1806 of classifying, at the processing module, the electrical noise into the two or more operating states of each electrical device of the one or more electrical devices using an expectation maximization clustering algorithm based on the features extracted from each of the extracted frames. In many embodiments, the expectation maximization clustering algorithm can be performed using clustering 1127 module (FIG. 11), such as described in block 1370 (FIG. 13) of clustering.

Turning ahead in the drawings, FIG. 19 illustrates a computer system 1900, all of which or a portion of which can be suitable for implementing an embodiment of at least a portion of computational unit 1020 (FIGS. 10-11), and/or at least a portion of the techniques of processing pipelines 1300 (FIG. 13) and/or method 1800 (FIG. 18). Computer system 1900 includes a chassis 1902 containing one or more circuit boards (not shown), a USB (universal serial bus) port 1912, a Compact Disc Read-Only Memory (CD-ROM) and/or Digital Video Disc (DVD) drive 1916, and a hard drive 1914. A representative block diagram of the elements included on the circuit boards inside chassis 1902 is shown in FIG. 20. A central processing unit (CPU) 2010 in FIG. 20 is coupled to a system bus 2014 in FIG. 20. In various embodiments, the architecture of CPU 2010 can be compliant with any of a variety of commercially distributed architecture families.

Continuing with FIG. 20, system bus 2014 also is coupled to memory 2008 that includes both read only memory (ROM) and random access memory (RAM). Non-volatile portions of memory storage unit 2008 or the ROM can be encoded with a boot code sequence suitable for restoring computer system 1900 (FIG. 19) to a functional state after a system reset. In addition, memory 2008 can include microcode such as a Basic Input-Output System (BIOS). In some examples, the one or more memory storage units of the various embodiments disclosed herein can comprise memory storage unit 2008, a USB-equipped electronic device, such as, an external memory storage unit (not shown) coupled to universal serial bus (USB) port 1912 (FIGS. 19-20), hard drive 1914 (FIGS. 19-20), and/or CD-ROM or DVD drive 1916 (FIGS. 19-20). In the same or different examples, the one or more memory storage units of the various embodiments disclosed herein can comprise an operating system, which can be a software program that manages the hardware and software resources of a computer and/or a computer network. The operating system can perform basic tasks such as, for example, controlling and allocating memory, prioritizing the processing of instructions, controlling input and output devices, facilitating networking, and managing files. Some examples of common operating systems can comprise Microsoft® Windows® operating system (OS), Mac® OS, UNIX® OS, and Linux® OS.

As used herein, "processor" and/or "processing module" means any type of computational circuit, such as but not limited to a microprocessor, a microcontroller, a controller, a complex instruction set computing (CISC) microprocessor, a reduced instruction set computing (RISC) microprocessor, a very long instruction word (VLIW) microprocessor, a graphics processor, a digital signal processor, or any other type of processor or processing circuit capable of performing the desired functions. In some examples, the one or more processors of the various embodiments disclosed herein can comprise CPU 2010.

In the depicted embodiment of FIG. 20, various I/O devices such as a disk controller 2004, a graphics adapter 2024, a video controller 2002, a keyboard adapter 2026, a mouse adapter 2006, a network adapter 2020, and other I/O devices 2022 can be coupled to system bus 2014. Keyboard adapter 2026 and mouse adapter 2006 are coupled to a keyboard 604 (FIGS. 19 and 20) and a mouse 1910 (FIGS. 19 and 20), respectively, of computer system 1900 (FIG. 19). While graphics adapter 2024 and video controller 2002 are indicated as distinct units in FIG. 20, video controller 2002 can be integrated into graphics adapter 2024, or vice versa in other embodiments. Video controller 2002 is suitable for refreshing a monitor 1906 (FIGS. 19 and 20) to display images on a screen 1908 (FIG. 19) of computer system 1900 (FIG. 19). Disk controller 2004 can control hard drive 1914 (FIGS. 19 and 20), USB port 1912 (FIGS. 19 and 20), and CD-ROM or DVD drive 1916 (FIGS. 19 and 20). In other embodiments, distinct units can be used to control each of these devices separately.

In some embodiments, network adapter 2020 can comprise and/or be implemented as a WNIC (wireless network interface controller) card (not shown) plugged or coupled to an expansion port (not shown) in computer system 1900 (FIG. 19). In other embodiments, the WNIC card can be a wireless network card built into computer system 1900 (FIG. 19). A wireless network adapter can be built into computer system 1900 (FIG. 19) by having wireless communication capabilities integrated into the motherboard chipset (not shown), or implemented via one or more dedicated wireless communication chips (not shown), connected through a PCI (peripheral component interconnector) or a PCI express bus of computer system 1900 (FIG. 19) or USB port 1912 (FIG. 19). In other embodiments, network adapter 2020 can comprise and/or be implemented as a wired network interface controller card (not shown).

Although many other components of computer system 1900 (FIG. 19) are not shown, such components and their interconnection are well known to those of ordinary skill in the art. Accordingly, further details concerning the construction and composition of computer system 1900 (FIG. 19) and the circuit boards inside chassis 1902 (FIG. 19) need not be discussed herein.

When computer system 1900 in FIG. 19 is running, program instructions stored on a USB drive in USB port 1912, on a CD-ROM or DVD in CD-ROM and/or DVD drive 1916, on hard drive 1914, or in memory 2008 (FIG. 20) are executed by CPU 2010 (FIG. 20). A portion of the program instructions, stored on these devices, can be suitable for carrying out all or at least part of the techniques described herein. In various embodiments, computer system 1900 can be reprogrammed with one or more modules, applications, and/or databases, such as those described herein, to convert a general purpose computer to a special purpose computer.

Although computer system 1900 is illustrated as a desktop computer in FIG. 19, there can be examples where computer system 1900 may take a different form factor while still having functional elements similar to those described for computer system 1900. In some embodiments, computer system 1900 may comprise a single computer, a single server, or a cluster or collection of computers or servers, or a cloud of computers or servers. Typically, a cluster or collection of servers can be used when the demand on computer system 1900 exceeds the reasonable capability of a single server or computer. In certain embodiments, computer system 1900 may comprise a portable computer, such as a laptop computer. In certain other embodiments, computer system 1900 may comprise a mobile device, such as a smartphone. In certain additional embodiments, computer system 1900 may comprise an embedded system.

Although the disclosure has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that any element of FIGS. 1-20 may be modified, and that the foregoing discussion of certain of these embodiments does not necessarily represent a complete description of all possible embodiments. For example, one or more of the procedures, processes, or activities of FIGS. 13 and 18 may include different procedures, processes, and/or activities and be performed by many different modules, in many different orders, and/or one or more of the procedures, processes, or activities of FIGS. 13 and 18 may include one or more of the procedures, processes, or activities of another different one of FIGS. 13 and 18.

Replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An apparatus comprising:
   a sensing device configured to be coupled to an electrical outlet, the sensing device comprising:
   a data acquisition receiver configured to receive electrical noise via the electrical outlet when the sensing device is coupled to the electrical outlet, the electrical outlet being electrically coupled to an electrical power infrastructure, one or more electrical devices being coupled to the electrical power infrastructure and generating at least a portion of the electrical noise on the electrical power infrastructure, and the data acquisition receiver being configured to convert the electrical noise into one or more first data signals; and
   a processing module configured to run on a processor of a computational unit, the sensing device being in communication with the computational unit, the processing module being configured to perform:
   extracting frames from the one or more first data signals;
   extracting a respective eight-tuple feature vector for each extracted frame of the frames, wherein the respective eight-tuple feature vector for the each extracted frame comprises:
   a respective mean magnitude of a peak electromagnetic interference (EMI) of the each extracted frame;
   a respective maximum magnitude of the peak EMI of the each extracted frame;
   a respective minimum magnitude of the peak EMI of the each extracted frame;
   a respective mean frequency of the peak EMI of the each extracted frame;
   a respective maximum frequency of the peak EMI of the each extracted frame;
   a respective minimum frequency of the peak EMI of the each extracted frame;
   a frequency gap between two dominant EMI peaks of the each extracted frame; and
   an overall mean energy of the each extracted frame;
   identifying each of two or more operating states of each of the one or more electrical devices at least in part using the respective eight-tuple feature vectors of the frames, wherein the two or more operating states of each electrical device of the one or more electrical devices are each different user-driven operating states of the electrical device when the electrical device is in an on-power state; and
   notifying a user when the each electrical device of the one or more electrical devices are in an operating state of the two or more operating states.

2. The apparatus of claim 1, wherein:
   the electrical noise comprises:
   first identifiable electrical noise on the electrical power infrastructure during a first time period corresponding to a first operating state of the two or more operating states; and
   second identifiable electrical noise on the electrical power infrastructure during a second time period corresponding to a second operating state of the two or more operating states; and
   the processing module is further configured to distinguish the first identifiable electrical noise from the second identifiable electrical noise to identify the two or more operating states of each of the one or more electrical devices.

3. The apparatus of claim 2, wherein:
   the first identifiable electrical noise and the second identifiable electrical noise each comprise substantially continuous electrical noise on the electrical power infrastructure; and
   the substantially continuous electrical noise comprises at least one of (a) first electrical noise that is identifiable on the electrical power infrastructure for a first length of time that is greater than one alternating current electrical cycle, or (b) second electrical noise that is identifiable on the electrical power infrastructure for a second length of time that is less than one alternating current electrical cycle but the second electrical noise is repeated in three or more alternating current electrical cycles.

4. The apparatus of claim 2, wherein:
   the first time period is at least 1 second; and
   the second time period is at least 1 second.

5. The apparatus of claim 1, wherein:
   the data acquisition receiver comprises a filter configured to pass the electrical noise that is above approximately 5.3 kilohertz.

6. The apparatus of claim 1, wherein:
   the processing module is further configured to classify the electrical noise into the two or more operating states of each electrical device of the one or more electrical devices using an expectation maximization clustering algorithm based on the respective eight-tuple feature vectors of the frames.

7. The apparatus of claim 1, wherein:
   the one or more electrical devices comprise one or more motor-based appliances each configured to be manually switched to two or more different rotational speeds; and
   each of the two or more operating states of the one or more motor-based appliances correspond to a different one of the two or more different rotational speeds.

8. The apparatus of claim 7, wherein:
   the one or more motor-based appliances comprise at least one of a blender or a food mixer.

9. The apparatus of claim 1, wherein:
the one or more electrical devices comprise a motor-based vacuum;
a first operating state of the two or more operating states corresponds to idling the motor-based vacuum on a rug;
a second operating state of the two or more operating states corresponds to moving the motor-based vacuum on the rug; and
a third operating state of the two or more operating states corresponds to using the motor-based vacuum on a hard floor.

10. The apparatus of claim 1, wherein:
the one or more electrical devices comprise one or more SMPS-based appliances each comprising an oscillator and each configured to operate at two or more different switching frequencies; and
each of the two or more operating states correspond to a different one of the two or more different switching frequencies.

11. The apparatus of claim 10, wherein:
the one or more SMPS-based appliances comprise a computer comprising a central processing unit; and
each of the two or more different switching frequencies correspond to a different load of the central processing unit.

12. The apparatus of claim 10, wherein:
the one or more SMPS-based appliances comprise a television;
a first frequency of the two or more different switching frequencies corresponds to displaying a television channel on the television; and
a second frequency of the two or more different switching frequencies corresponds to a transient channel change operation of the television.

13. The apparatus of claim 1, wherein:
the one or more electrical devices comprise one or more appliances each comprising two or more different switched resistive loads;
each of the two or more operating states correspond to a different one of the two or more different switched resistive loads; and
the one or more appliances comprise at least one of a hair dryer or a fan heater.

14. A method comprising:
capturing, at a sensing device coupled to an electrical outlet, electrical noise via the electrical outlet, the electrical outlet being coupled to an electrical power infrastructure, and one or more electrical devices being coupled to the electrical power infrastructure and generating at least a portion of the electrical noise on the electrical power infrastructure;
converting, at the sensing device, the electrical noise into one or more first data signals;
transmitting the one or more first data signals from the sensing device to a computational unit;
extracting frames from the one or more first data signals;
extracting a respective eight-tuple feature vector for each extracted frame of the frames, wherein the respective eight-tuple feature vector for the each extracted frame comprises:
a respective mean magnitude of a peak electromagnetic interference (EMI) of the each extracted frame;
a respective maximum magnitude of the peak EMI of the each extracted frame;
a respective minimum magnitude of the peak EMI of the each extracted frame;
a respective mean frequency of the peak EMI of the each extracted frame;
a respective maximum frequency of the peak EMI of the each extracted frame;
a respective minimum frequency of the peak EMI of the each extracted frame;
a frequency gap between two dominant EMI peaks of the each extracted frame; and
an overall mean energy of the each extracted frame;
identifying, at a processing module of the computational unit, each of two or more operating states of each of the one or more electrical devices at least in part using the respective eight-tuple feature vectors of the frames, wherein the two or more operating states of each electrical device of the one or more electrical devices are each different user-driven operating states of the electrical device when the electrical device is in an on-power state; and
notifying a user when the each electrical device of the one or more electrical devices are in an operating state of the two or more operating states.

15. The method of claim 14, wherein:
the one or more electrical devices comprise one or more motor-based appliances each configured to be manually switched to two or more different rotational speeds; and
each of the two or more operating states of the one or more motor-based appliances correspond to a different one of the two or more different rotational speeds.

16. The method of claim 14, wherein:
the one or more electrical devices comprise a motor-based vacuum;
a first operating state of the two or more operating states corresponds to idling the motor-based vacuum on a rug;
a second operating state of the two or more operating states corresponds to moving the motor-based vacuum on the rug; and
a third operating state of the two or more operating states corresponds to using the motor-based vacuum on a hard floor.

17. The method of claim 14, wherein:
the one or more electrical devices comprise one or more SMPS-based appliances each comprising an oscillator and each configured to operate at two or more different switching frequencies; and
each of the two or more operating states correspond to a different one of the two or more different switching frequencies.

18. The method of claim 14, wherein:
the one or more electrical devices comprise one or more appliances each comprising two or more different switched resistive loads; and
each of the two or more operating states correspond to a different one of the two or more different switched resistive loads.

19. The method of claim 14 further comprising:
classifying the electrical noise into the two or more operating states of each electrical device of the one or more electrical devices using an expectation maximization clustering algorithm based on the respective eight-tuple feature vectors of the frames.

20. The method of claim 14, wherein:
the electrical noise comprises:
first identifiable electrical noise on the electrical power infrastructure during a first time period corresponding to a first operating state of the two or more operating states; and second identifiable electrical noise on the electrical power infrastructure during a second time period corresponding to a second operating state of the two or more operating states; and the processing module is further configured to distinguish the first identifiable electrical noise from the second identifiable electrical noise to identify the two or more operating states of each of the one or more electrical devices.

* * * * *